US011057156B2

United States Patent
Hong et al.

(10) Patent No.: US 11,057,156 B2
(45) Date of Patent: Jul. 6, 2021

(54) ADVANCED POLAR CODES FOR CONTROL CHANNEL

(71) Applicant: IDAC Holdings, Inc., Wilmington, DE (US)

(72) Inventors: Sungkwon Hong, Dongjak-gu (KR); Chunxuan Ye, San Diego, CA (US); Kyle Jung-Lin Pan, Saint James, NY (US); Fengjun Xi, San Diego, CA (US)

(73) Assignee: IDAC Holdings, Inc., Wilmington, DE (US)

(*) Notice: Subject to any disclaimer, the term of this patent is extended or adjusted under 35 U.S.C. 154(b) by 0 days.

(21) Appl. No.: 16/482,025

(22) PCT Filed: Feb. 1, 2018

(86) PCT No.: PCT/US2018/016364
§ 371 (c)(1),
(2) Date: Jul. 30, 2019

(87) PCT Pub. No.: WO2018/144683
PCT Pub. Date: Aug. 9, 2018

(65) Prior Publication Data
US 2019/0393987 A1 Dec. 26, 2019

Related U.S. Application Data

(60) Provisional application No. 62/454,108, filed on Feb. 3, 2017.

(51) Int. Cl.
*H04L 1/00* (2006.01)

(52) U.S. Cl.
CPC .......... *H04L 1/0072* (2013.01); *H04L 1/0041* (2013.01); *H04L 1/0061* (2013.01)

(58) Field of Classification Search
CPC .................................................... H04L 1/0072
See application file for complete search history.

(56) References Cited

U.S. PATENT DOCUMENTS

2016/0182187 A1* 6/2016 Kim ...................... H04L 1/1861
714/807
2017/0288936 A1* 10/2017 Park ....................... H04L 27/32
(Continued)

FOREIGN PATENT DOCUMENTS

JP 2011-512103 A 4/2011
WO WO 2009-120626 A1 10/2009

OTHER PUBLICATIONS

3rd Generation Partnership Project (3GPP), R1-1608863, "Evaluation of Channel Coding Schemes for Control Channel", Huawei, HiSilicon, TSG RAN WG1 Meeting #86b, Lisbon, Portugal, Oct. 10-14, 2016, 9 pages.
(Continued)

*Primary Examiner* — Andrew Lai
*Assistant Examiner* — Andrew C Lee
(74) *Attorney, Agent, or Firm* — Condo Roccia Koptiw LLP

(57) ABSTRACT

Systems, methods, and instrumentalities may be provided for an infrastructure node to transmit and a wireless transmit/receive unit (WTRU) or a group of WTRUs to receive a first downlink control information (DCI) a second DCI. The first DCI may carry time critical DCI, whereas the second DCI may carry non-time critical DCI. Each of the first DCI and the second DCI may be polar encoded. The second DCI may be polar encoded may be received with an embedded first DCI as part of frozen bits. The second DCI may be mapped to a plurality of bit channels having higher reliability than the plurality of bit channels to which the embedded first DCI is mapped. The WTRU may discard the
(Continued)

decoded first DCI, if decoding of the DCI using the embedded first DCI is not successful.

18 Claims, 21 Drawing Sheets

(56) References Cited

U.S. PATENT DOCUMENTS

| | | | | |
|---|---|---|---|---|
| 2017/0331577 | A1* | 11/2017 | Parkvall | H04J 11/0079 |
| 2017/0331670 | A1* | 11/2017 | Parkvall | H04W 24/10 |
| 2018/0019766 | A1* | 1/2018 | Yang | H03M 13/13 |
| 2018/0041992 | A1* | 2/2018 | Bin Sediq | H04L 5/0007 |
| 2018/0198467 | A1* | 7/2018 | Nammi | H04L 1/0002 |
| 2018/0198894 | A1* | 7/2018 | Nammi | H03M 13/2906 |
| 2018/0351579 | A1* | 12/2018 | Hong | H03M 13/13 |

OTHER PUBLICATIONS

3rd Generation Partnership Project (3GPP), R1-1611254, "Details of the Polar Code Design", Huawei, HiSilicon, TSG RAN WG1 Meeting #87, Reno, USA, Nov. 10-14, 2016, 15 pages.

3rd Generation Partnership Project (3GPP), R1-1612121, "On 2-Stage Downlink Control Information for NR", MediaTek Inc., TSG RAN WG1 Meeting #87, Reno, USA, Nov. 14-18, 2016, 5 pages.

3rd Generation Partnership Project (3GPP), R1-1612135, "Comparison of Coding Candidates for DL Control Channels and Extended Applications", MediaTek Inc., TSG RAN WG1 Meeting #87, Reno, USA, Nov. 14-18, 2016, 5 pages.

3rd Generation Partnership Project (3GPP), R1-162588, "DCI Design for Short TTI", Huawei, HiSilicon, TSG RAN WG1 Meeting #84bis, Busan, Korea, Apr. 11-15, 2016, 11 pages.

3rd Generation Partnership Project (3GPP), R1-1700112, "Polar Code Design for Control Channel of NR", Ericsson, TSG RAN WG1 AH_NR Meeting, Spokane, USA, Jan. 16-20, 2017, 3 pages.

Arikan, Erdal, "Channel Polarization: A Method for Constructing Capacity-Achieving Codes for Symmetric Binary-Input Memoryless Channels", IEEE Transactions on Information Theory, vol. 55, No. 7, Jul. 2009, pp. 3051-3073.

Shin et al., "Mapping Selection and Code Construction for $2^m$-ary Polar-Coded Modulation", IEEE Communications Letters, vol. 16, No. 6, Jun. 2012, pp. 905-908.

Tian et al., "Joint Successive Cancellation Decoding for Bit-Interleaved Polar Coded Modulation", IEEE Communications Letters, vol. 20, No. 2, Feb. 2016, pp. 224-227.

Trifonov, Peter, "Efficient Design and Decoding of Polar Codes", IEEE Transactions on Communications, vol. 60, No. 11, Nov. 2012, pp. 3221-3227.

Vangala et al., "A Comparative Study of Polar Code Constructions for the AWGN Channel", arXiv:1501.02473v1, Jan. 11, 2015, pp. 1-9.

Wang et al., "A Novel Puncturing Scheme for Polar Codes", IEEE Communications Letters, vol. 18, No. 12, Dec. 2014, pp. 2081-2084.

$3^{rd}$ Generation Partnership Program, TSG-RAN WG1 NR AdHoc, "2-Stage DCI", Qualcomm Incorporated, 3GPP TSG-RAN WG1 R1-1700815, Spokane, USA, Jan. 16-20, 2017, 4 pages.

* cited by examiner

ADVANCED POLAR CODES FOR CONTROL CHANNEL

CROSS-REFERENCE TO RELATED APPLICATIONS

This application is the National Stage entry under 35 U.S.C. § 371 of Patent Cooperation Treaty Application PCT/US2018/016364, filed Feb. 1, 2018, which claims the benefit of U.S. Provisional Patent Application No. 62/454,108, filed Feb. 3, 2017, the contents of which are incorporated by reference.

BACKGROUND

In next generation mobile communications, a variety of radio access technologies (RATs), such as New Radio (NR) may be implemented. Applications such as enhanced mobile broadband (eMBB), massive Machine Type Communications (mMTC) and Ultra-Reliable Low Latency Communications (URLLC) may be deployed as part of NR. Existing coding schemes used for transmission of control information and/or data may be supplemented by new coding schemes.

SUMMARY

Systems, methods, and instrumentalities may be provided for receiving (e.g., from an infrastructure node) two stage polar encoded downlink control information (DCI) by a wireless transmit/receive unit (WTRU). A WTRU may receive a polar encoded first DCI. The polar encoded first DCI may include time critical DCI, for example, one or more of allocation information for a physical downlink shared channel (PDSCH) or a physical uplink shared channel PUSCH, rank information, or modulation order. The WTRU may decode the polar encoded first DCI.

The WTRU may receive a polar encoded second DCI. The second DCI may be received with an embedded first DCI as part of a frozen set. The polar encoded second DCI may include non-time critical DCI. The non-time critical DCI may include one or more of a new data indication (NDI), a redundancy version (RV), or a modulation and coding scheme (MCS). The polar encoded masked first DCI may be part of a frozen set.

The embedded first DCI may include the first DCI that is masked with at least part of a WTRU identity (WTRU ID) or a group identity (group ID). The first DCI and the at least part of the WTRU ID or the group ID may be combined using an XOR operation.

The WTRU may receive the polar encoded second DCI via a plurality of first bit channels and the embedded first DCI via a plurality of second bit channels. The plurality of first bit channels may be of higher reliability than the plurality of second bit channels. The WTRU may decode the polar encoded second DCI using the decoded first DCI. The WTRU may discard the decoded first DCI, if decoding of the second DCI using the decoded first DCI is not successful.

The WTRU may be part of a configured group of WTRUs. Each of the first DCI and the second DCI may be a group DCI associated with the configured group of WTRUs.

Systems, methods, and instrumentalities may be provided for an infrastructure node to divide control information, for example, downlink control information (DCI) corresponding to a wireless transmit/receive unit (WTRU) or a group of WTRUs. The infrastructure node may be a gNode B, a Node-B, an eNode B, a Home Node B, a Home eNode B, a gNB, or a NR NodeB. The infrastructure node may divide DCI into two DCIs—a first DCI and a second DCI. The first DCI may carry time critical DCI, and the second DCI may carry non-time critical DCI. The infrastructure node may polar encode the first DCI.

The infrastructure node may mask the first DCI with at least part of a WTRU ID or a group ID. The infrastructure node may combine the first DCI with at least part of a WTRU ID or a group ID, for example, using an XOR operation. The WTRU ID or the group ID masked first DCI may be part of frozen bits.

The infrastructure node may polar encode the second DCI. The infrastructure node may polar encode the second DCI using the first DCI or masked first DCI as frozen bits. The infrastructure node may map the second DCI to a first plurality of bit channels. The infrastructure node may map the masked first DCI to a second plurality of bit channels. The first plurality of bit channels may be of higher reliability than the second plurality of bit channels.

The infrastructure node may send the first DCI, the second DCI, and the embedded first DCI to a WTRU that may be part of a configured group of WTRUs. The first DCI and the second DCI may be a group DCI.

DETAILED DESCRIPTION

A detailed description of illustrative embodiments will now be described with reference to the various figures. Although this description provides a detailed example of possible implementations, it should be noted that the details are intended to be exemplary and in no way limit the scope of the application.

Figure 1A:
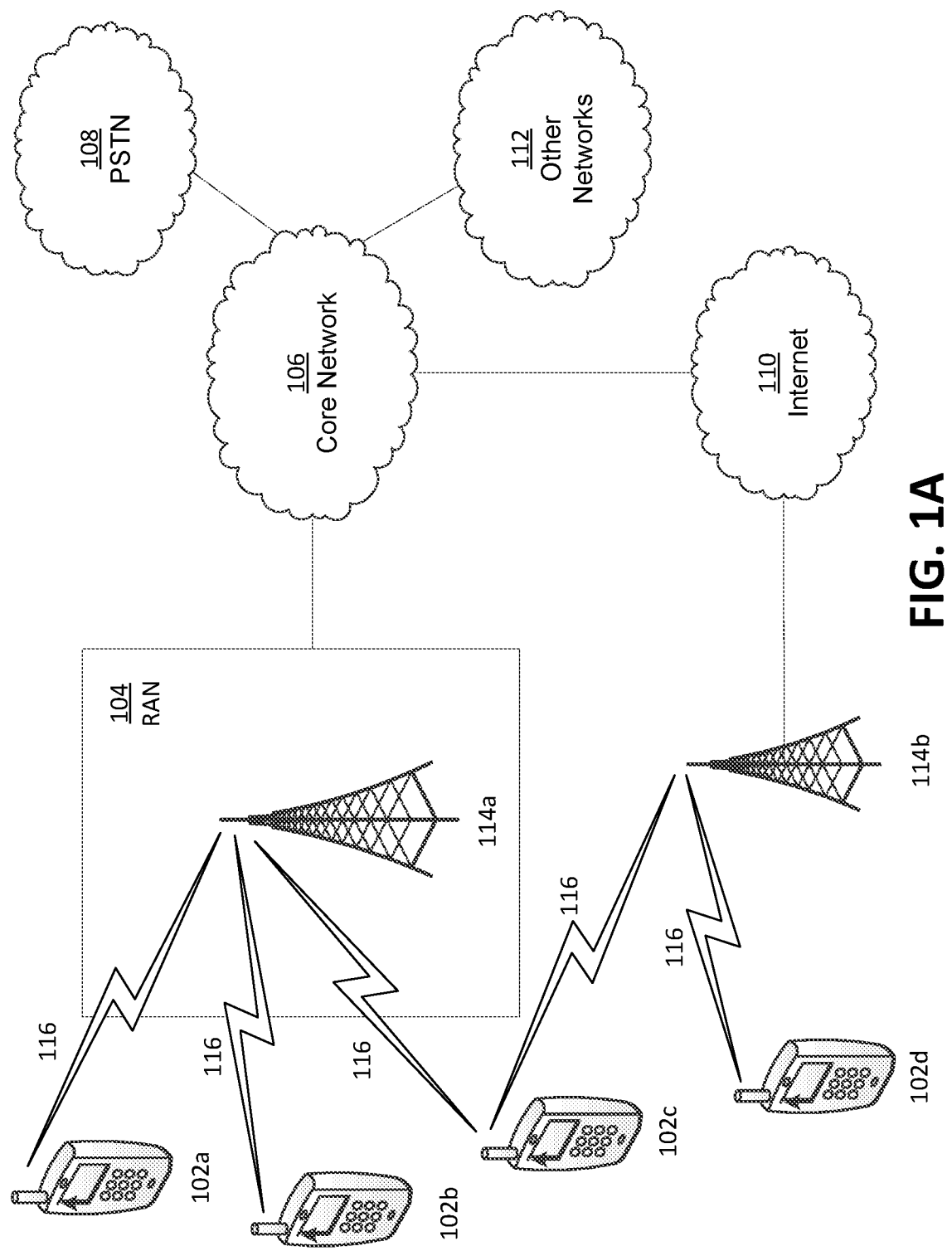
FIG. 1A is a system diagram illustrating an example communications system in which one or more disclosed embodiments may be implemented.

FIG. 1A is a diagram illustrating an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), zero-tail unique-word DFT-Spread OFDM (ZT UW DTS-s OFDM), unique word OFDM (UW-OFDM), resource block-filtered OFDM, filter bank multicarrier (FBMC), and the like.

As shown in FIG. 1A, the communications system 100 may include wireless transmit/receive units (WTRUs) 102a, 102b, 102c, 102d, a RAN 104/113, a CN 106/115, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d, any of which may be referred to as a "station" and/or a "STA", may be configured to transmit and/or receive wireless signals and may include a user equipment (UE), a mobile station, a fixed or mobile subscriber unit, a subscription-based unit, a pager, a cellular telephone, a personal digital assistant (PDA), a smartphone, a laptop, a netbook, a personal computer, a wireless sensor, a hotspot or Mi-Fi device, an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. Any of the WTRUs 102a, 102b, 102c and 102d may be interchangeably referred to as a UE.

The communications systems 100 may also include a base station 114a and/or a base station 114b. Each of the base stations 114a, 114b may be any type of device configured to wirelessly interface with at least one of the WTRUs 102a, 102b, 102c, 102d to facilitate access to one or more communication networks, such as the CN 106/115, the Internet 110, and/or the other networks 112. By way of example, the base stations 114a, 114b may be a base transceiver station (BTS), a Node-B, an eNode B, a Home Node B, a Home eNode B, a gNB, a NR NodeB, a site controller, an access point (AP), a wireless router, and the like. While the base stations 114a, 114b are each depicted as a single element, it will be appreciated that the base stations 114a, 114b may include any number of interconnected base stations and/or network elements.

The base station 114a may be part of the RAN 104/113, which may also include other base stations and/or network elements (not shown), such as a base station controller (BSC), a radio network controller (RNC), relay nodes, etc. The base station 114a and/or the base station 114b may be configured to transmit and/or receive wireless signals on one or more carrier frequencies, which may be referred to as a cell (not shown). These frequencies may be in licensed spectrum, unlicensed spectrum, or a combination of licensed and unlicensed spectrum. A cell may provide coverage for a wireless service to a specific geographical area that may be relatively fixed or that may change over time. The cell may further be divided into cell sectors. For example, the cell associated with the base station 114a may be divided into three sectors. Thus, in one embodiment, the base station 114a may include three transceivers, i.e., one for each sector of the cell. In an embodiment, the base station 114a may employ multiple-input multiple output (MIMO) technology and may utilize multiple transceivers for each sector of the cell. For example, beamforming may be used to transmit and/or receive signals in desired spatial directions.

The base stations 114a, 114b may communicate with one or more of the WTRUs 102a, 102b, 102c, 102d over an air interface 116, which may be any suitable wireless communication link (e.g., radio frequency (RF), microwave, centimeter wave, micrometer wave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114a in the RAN 104/113 and the WTRUs 102a, 102b, 102c may implement a radio technology such as Universal Mobile Telecommunications System (UMTS) Terrestrial Radio Access (UTRA), which may establish the air interface 115/116/117 using wideband CDMA (WCDMA). WCDMA may include communication protocols such as High-Speed Packet Access (HSPA) and/or Evolved HSPA (HSPA+). HSPA may include High-Speed Downlink (DL) Packet Access (HSDPA) and/or High-Speed UL Packet Access (HSUPA).

In an embodiment, the base station 114a and the WTRUs 102a, 102b, 102c may implement a radio technology such as Evolved UMTS Terrestrial Radio Access (E-UTRA), which may establish the air interface 116 using Long Term Evolution (LTE) and/or LTE-Advanced (LTE-A) and/or LTE-Advanced Pro (LTE-A Pro).

In an embodiment, the base station 114a and the WTRUs 102a, 102b, 102c may implement a radio technology such as NR Radio Access, which may establish the air interface 116 using New Radio (NR).

In an embodiment, the base station 114a and the WTRUs 102a, 102b, 102c may implement multiple radio access technologies. For example, the base station 114a and the WTRUs 102a, 102b, 102c may implement LTE radio access and NR radio access together, for instance using dual connectivity (DC) principles. Thus, the air interface utilized by WTRUs 102a, 102b, 102c may be characterized by multiple types of radio access technologies and/or transmissions sent to/from multiple types of base stations (e.g., a eNB and a gNB).

In other embodiments, the base station 114a and the WTRUs 102a, 102b, 102c may implement radio technologies such as IEEE 802.11 (i.e., Wireless Fidelity (WiFi), IEEE 802.16 (i.e., Worldwide Interoperability for Microwave Access (WiMAX)), CDMA2000, CDMA2000 1x, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 1A may be a wireless router, Home Node B, Home eNode B, or access point, for example, and may utilize any suitable RAT for facilitating wireless connectivity in a localized area, such as a place of business, a home, a vehicle, a campus, an industrial facility, an air corridor (e.g., for use by drones), a roadway, and the like. In one embodiment, the base station 114b and the WTRUs 102c, 102d may implement a radio technology such as IEEE 802.11 to establish a wireless local area network (WLAN). In an embodiment, the base station 114b and the WTRUs 102c, 102d may implement a radio technology such as IEEE 802.15 to establish a wireless personal area network (WPAN). In yet another embodiment, the base station 114b and the WTRUs 102c, 102d may utilize a cellular-based RAT (e.g., WCDMA, CDMA2000, GSM, LTE, LTE-A, LTE-A Pro, NR etc.) to establish a picocell or femtocell. As shown in FIG. 1A, the base station 114b may have a direct connection to the Internet 110. Thus, the base station 114b may not be required to access the Internet 110 via the CN 106/115.

The RAN 104/113 may be in communication with the CN 106/115, which may be any type of network configured to provide voice, data, applications, and/or voice over internet protocol (VoIP) services to one or more of the WTRUs 102a, 102b, 102c, 102d. The data may have varying quality of service (QoS) requirements, such as differing throughput requirements, latency requirements, error tolerance requirements, reliability requirements, data throughput requirements, mobility requirements, and the like. The CN 106/115 may provide call control, billing services, mobile location-based services, pre-paid calling, Internet connectivity, video distribution, etc., and/or perform high-level security functions, such as user authentication. Although not shown in FIG. 1A, it will be appreciated that the RAN 104/113 and/or the CN 106/115 may be in direct or indirect communication with other RANs that employ the same RAT as the RAN 104/113 or a different RAT. For example, in addition to being connected to the RAN 104/113, which may be utilizing a NR radio technology, the CN 106/115 may also be in communication with another RAN (not shown) employing a GSM, UMTS, CDMA 2000, WiMAX, E-UTRA, or WiFi radio technology.

The CN 106/115 may also serve as a gateway for the WTRUs 102a, 102b, 102c, 102d to access the PSTN 108, the Internet 110, and/or the other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and/or the internet protocol (IP) in the TCP/IP internet protocol suite. The networks 112 may include wired and/or wireless communications networks owned and/or operated by other service providers. For example, the networks 112 may include another CN connected to one or more RANs, which may employ the same RAT as the RAN 104/113 or a different RAT.

Some or all of the WTRUs 102a, 102b, 102c, 102d in the communications system 100 may include multi-mode capabilities (e.g., the WTRUs 102a, 102b, 102c, 102d may include multiple transceivers for communicating with different wireless networks over different wireless links). For example, the WTRU 102c shown in FIG. 1A may be configured to communicate with the base station 114a, which may employ a cellular-based radio technology, and with the base station 114b, which may employ an IEEE 802 radio technology.

Figure 1B:
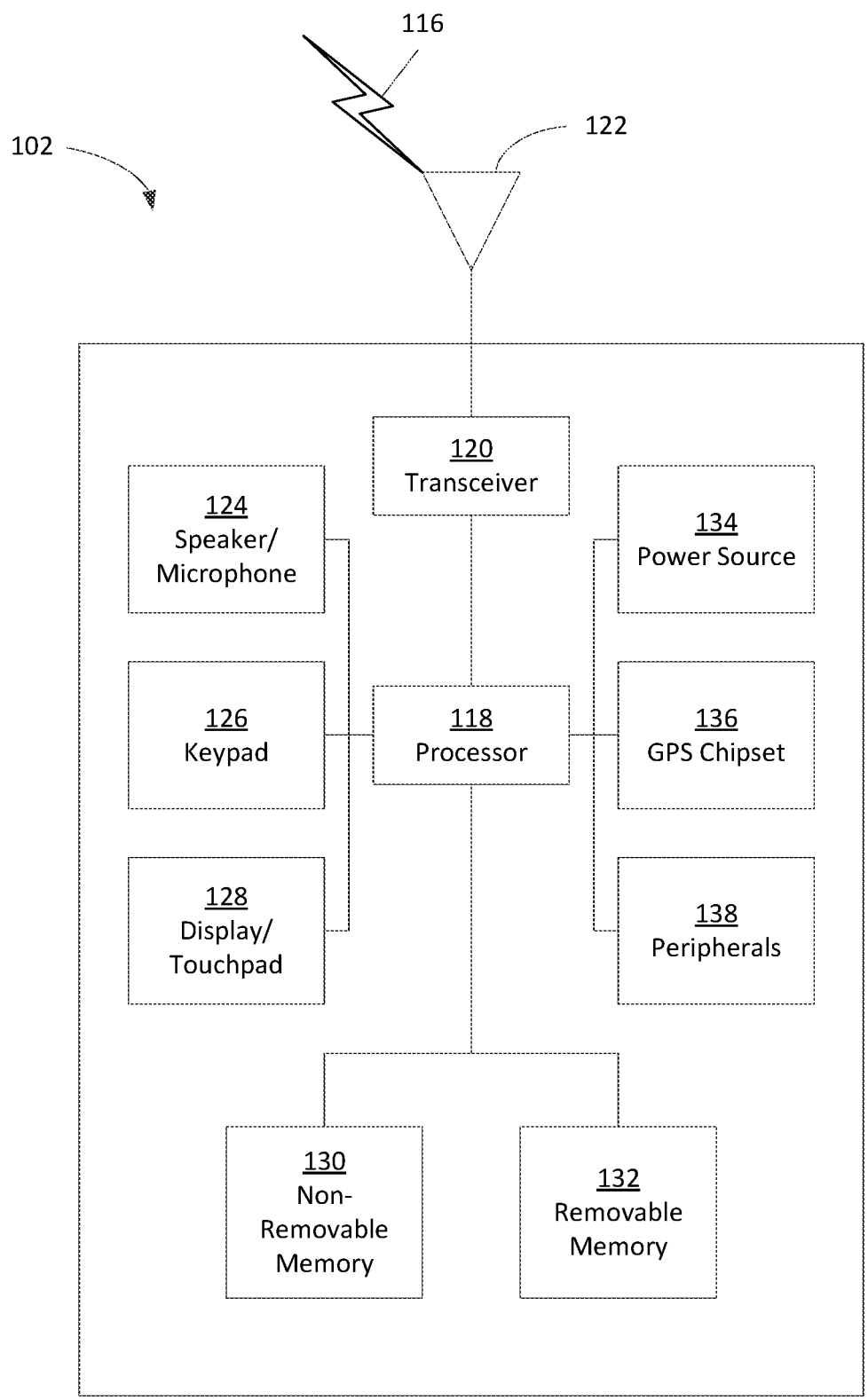
FIG. 1B is a system diagram illustrating an example wireless transmit/receive unit (WTRU) that may be used within the communications system illustrated in FIG. 1A according to an embodiment.

FIG. 1B is a system diagram illustrating an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and/or other peripherals 138, among others. It will be appreciated that the WTRU 102 may include any sub-combination of the foregoing elements while remaining consistent with an embodiment.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In an embodiment, the transmit/receive element 122 may be an emitter/detector configured to transmit and/or receive IR, UV, or visible light signals, for example. In yet another embodiment, the transmit/receive element 122 may be configured to transmit and/or receive both RF and light signals. It will be appreciated that the transmit/receive element 122 may be configured to transmit and/or receive any combination of wireless signals.

Although the transmit/receive element 122 is depicted in FIG. 1B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as NR and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs and/or video), a universal serial bus (USB) port, a vibration device, a television transceiver, a hands free headset, a Bluetooth® module, a frequency modulated (FM) radio unit, a digital music player, a media player, a video game player module, an Internet browser, a Virtual Reality and/or Augmented Reality (VR/AR) device, an activity tracker, and the like. The peripherals 138 may include one or more sensors, the sensors may be one or more of a gyroscope, an accelerometer, a hall effect sensor, a magnetometer, an orientation sensor, a proximity sensor, a temperature sensor, a time sensor; a geolocation sensor; an altimeter, a light sensor, a touch sensor, a magnetometer, a barometer, a gesture sensor, a biometric sensor, and/or a humidity sensor.

The WTRU 102 may include a full duplex radio for which transmission and reception of some or all of the signals (e.g., associated with particular subframes for both the UL (e.g., for transmission) and downlink (e.g., for reception) may be concurrent and/or simultaneous. The full duplex radio may include an interference management unit to reduce and or substantially eliminate self-interference via either hardware (e.g., a choke) or signal processing via a processor (e.g., a separate processor (not shown) or via processor 118). In an embodiment, the WRTU 102 may include a half-duplex radio for which transmission and reception of some or all of the signals (e.g., associated with particular subframes for either the UL (e.g., for transmission) or the downlink (e.g., for reception)).

Figure 1C:
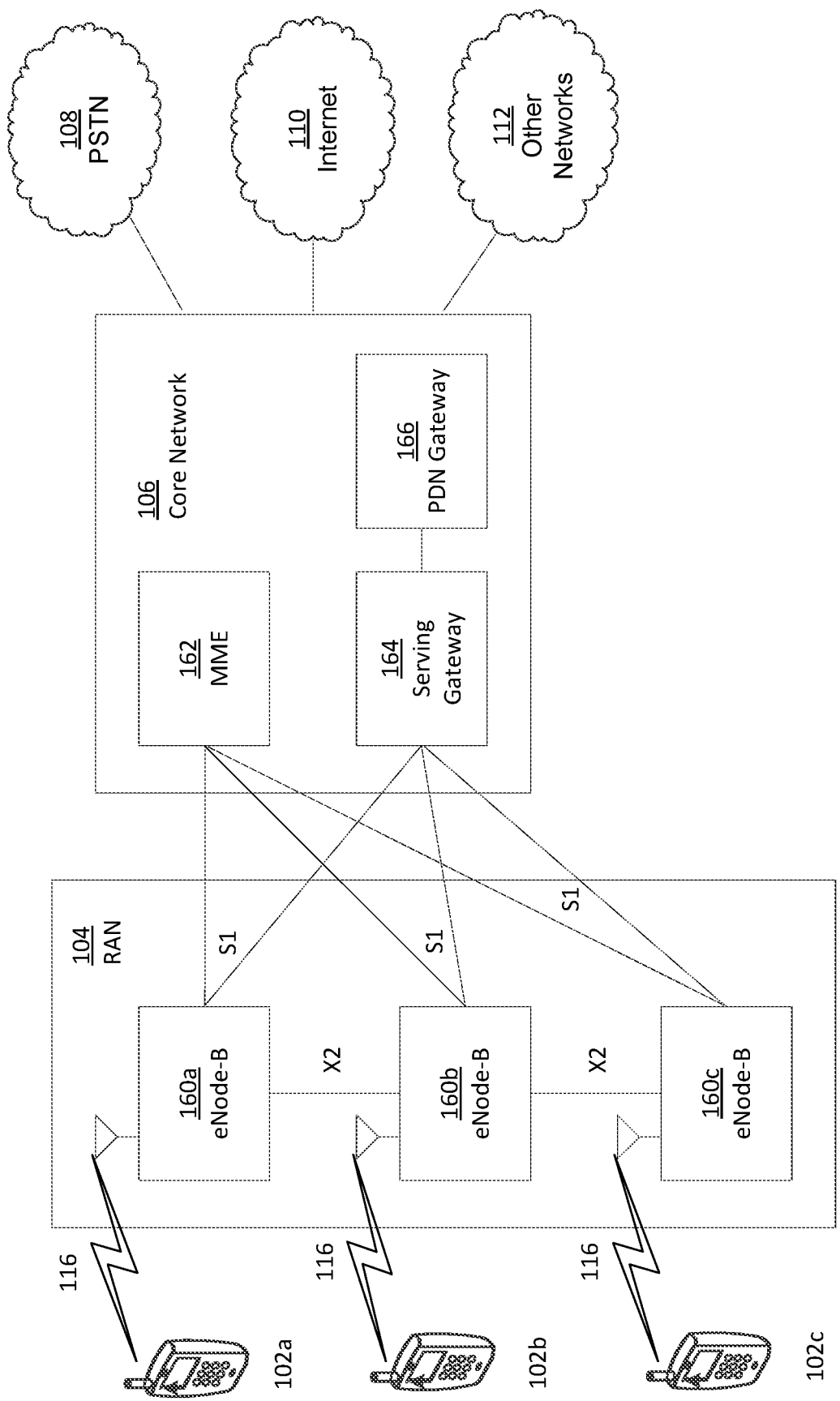
FIG. 1C is a system diagram illustrating an example radio access network (RAN) and an example core network (CN) that may be used within the communications system illustrated in FIG. 1A according to an embodiment.

FIG. 1C is a system diagram illustrating the RAN 104 and the CN 106 according to an embodiment. As noted above, the RAN 104 may employ an E-UTRA radio technology to communicate with the WTRUs 102a, 102b, 102c over the air interface 116. The RAN 104 may also be in communication with the CN 106.

The RAN 104 may include eNode-Bs 160a, 160b, 160c, though it will be appreciated that the RAN 104 may include any number of eNode-Bs while remaining consistent with an embodiment. The eNode-Bs 160a, 160b, 160c may each include one or more transceivers for communicating with the WTRUs 102a, 102b, 102c over the air interface 116. In one embodiment, the eNode-Bs 160a, 160b, 160c may implement MIMO technology. Thus, the eNode-B 160a, for example, may use multiple antennas to transmit wireless signals to, and/or receive wireless signals from, the WTRU 102a.

Each of the eNode-Bs 160a, 160b, 160c may be associated with a particular cell (not shown) and may be configured to handle radio resource management decisions, handover decisions, scheduling of users in the UL and/or DL, and the like. As shown in FIG. 1C, the eNode-Bs 160a, 160b, 160c may communicate with one another over an X2 interface.

The CN 106 shown in FIG. 1C may include a mobility management entity (MME) 162, a serving gateway (SGW) 164, and a packet data network (PDN) gateway (or PGW) 166. While each of the foregoing elements are depicted as part of the CN 106, it will be appreciated that any of these elements may be owned and/or operated by an entity other than the CN operator.

The MME 162 may be connected to each of the eNode-Bs 162a, 162b, 162c in the RAN 104 via an S1 interface and may serve as a control node. For example, the MME 162 may be responsible for authenticating users of the WTRUs 102a, 102b, 102c, bearer activation/deactivation, selecting a particular serving gateway during an initial attach of the WTRUs 102a, 102b, 102c, and the like. The MME 162 may provide a control plane function for switching between the RAN 104 and other RANs (not shown) that employ other radio technologies, such as GSM and/or WCDMA.

The SGW 164 may be connected to each of the eNode Bs 160a, 160b, 160c in the RAN 104 via the S1 interface. The SGW 164 may generally route and forward user data packets to/from the WTRUs 102a, 102b, 102c. The SGW 164 may perform other functions, such as anchoring user planes during inter-eNode B handovers, triggering paging when DL data is available for the WTRUs 102a, 102b, 102c, managing and storing contexts of the WTRUs 102a, 102b, 102c, and the like.

The SGW 164 may be connected to the PGW 166, which may provide the WTRUs 102a, 102b, 102c with access to packet-switched networks, such as the Internet 110, to facilitate communications between the WTRUs 102a, 102b, 102c and IP-enabled devices.

The CN 106 may facilitate communications with other networks. For example, the CN 106 may provide the WTRUs 102a, 102b, 102c with access to circuit-switched networks, such as the PSTN 108, to facilitate communications between the WTRUs 102a, 102b, 102c and traditional land-line communications devices. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers.

Although the WTRU is described in FIGS. 1A-1D as a wireless terminal, it is contemplated that in certain representative embodiments that such a terminal may use (e.g., temporarily or permanently) wired communication interfaces with the communication network.

In representative embodiments, the other network 112 may be a WLAN.

A WLAN in Infrastructure Basic Service Set (BSS) mode may have an Access Point (AP) for the BSS and one or more stations (STAs) associated with the AP. The AP may have an access or an interface to a Distribution System (DS) or another type of wired/wireless network that carries traffic in to and/or out of the BSS. Traffic to STAs that originates from outside the BSS may arrive through the AP and may be delivered to the STAs. Traffic originating from STAs to destinations outside the BSS may be sent to the AP to be delivered to respective destinations. Traffic between STAs within the BSS may be sent through the AP, for example, where the source STA may send traffic to the AP and the AP may deliver the traffic to the destination STA. The traffic between STAs within a BSS may be considered and/or referred to as peer-to-peer traffic. The peer-to-peer traffic may be sent between (e.g., directly between) the source and destination STAs with a direct link setup (DLS). In certain representative embodiments, the DLS may use an 802.11e DLS or an 802.11z tunneled DLS (TDLS). A WLAN using an Independent BSS (IBSS) mode may not have an AP, and the STAs (e.g., all of the STAs) within or using the IBSS may communicate directly with each other. The IBSS mode of communication may sometimes be referred to herein as an "ad-hoc" mode of communication.

When using the 802.11ac infrastructure mode of operation or a similar mode of operations, the AP may transmit a beacon on a fixed channel, such as a primary channel. The primary channel may be a fixed width (e.g., 20 MHz wide bandwidth) or a dynamically set width via signaling. The primary channel may be the operating channel of the BSS and may be used by the STAs to establish a connection with the AP. In certain representative embodiments, Carrier Sense Multiple Access with Collision Avoidance (CSMA/CA) may be implemented, for example in in 802.11 systems. For CSMA/CA, the STAs (e.g., every STA), including the AP, may sense the primary channel. If the primary channel is sensed/detected and/or determined to be busy by a particular STA, the particular STA may back off. One STA (e.g., only one station) may transmit at any given time in a given BSS.

High Throughput (HT) STAs may use a 40 MHz wide channel for communication, for example, via a combination of the primary 20 MHz channel with an adjacent or nonadjacent 20 MHz channel to form a 40 MHz wide channel.

Very High Throughput (VHT) STAs may support 20 MHz, 40 MHz, 80 MHz, and/or 160 MHz wide channels. The 40 MHz, and/or 80 MHz, channels may be formed by combining contiguous 20 MHz channels. A 160 MHz channel may be formed by combining 8 contiguous 20 MHz channels, or by combining two non-contiguous 80 MHz channels, which may be referred to as an 80+80 configuration. For the 80+80 configuration, the data, after channel encoding, may be passed through a segment parser that may divide the data into two streams. Inverse Fast Fourier Transform (IFFT) processing, and time domain processing, may be done on each stream separately. The streams may be mapped on to the two 80 MHz channels, and the data may be transmitted by a transmitting STA. At the receiver of the receiving STA, the above described operation for the 80+80 configuration may be reversed, and the combined data may be sent to the Medium Access Control (MAC).

Sub 1 GHz modes of operation are supported by 802.11af and 802.11ah. The channel operating bandwidths, and carriers, are reduced in 802.11af and 802.11ah relative to those used in 802.11n, and 802.11ac. 802.11af supports 5 MHz, 10 MHz and 20 MHz bandwidths in the TV White Space (TVWS) spectrum, and 802.11ah supports 1 MHz, 2 MHz, 4 MHz, 8 MHz, and 16 MHz bandwidths using non-TVWS spectrum. According to a representative embodiment, 802.11ah may support Meter Type Control/Machine-Type Communications, such as MTC devices in a macro coverage area. MTC devices may have certain capabilities, for example, limited capabilities including support for (e.g., only support for) certain and/or limited bandwidths. The MTC devices may include a battery with a battery life above a threshold (e.g., to maintain a very long battery life).

WLAN systems, which may support multiple channels, and channel bandwidths, such as 802.11n, 802.11ac, 802.11af, and 802.11ah, include a channel which may be designated as the primary channel. The primary channel may have a bandwidth equal to the largest common operating bandwidth supported by all STAs in the BSS. The bandwidth of the primary channel may be set and/or limited by a STA, from among all STAs in operating in a BSS, which supports the smallest bandwidth operating mode. In the example of 802.11ah, the primary channel may be 1 MHz wide for STAs (e.g., MTC type devices) that support (e.g., only support) a 1 MHz mode, even if the AP, and other STAs in the BSS support 2 MHz, 4 MHz, 8 MHz, 16 MHz, and/or other channel bandwidth operating modes. Carrier sensing and/or Network Allocation Vector (NAV) settings may depend on the status of the primary channel. If the primary channel is busy, for example, due to a STA (which supports only a 1 MHz operating mode), transmitting to the AP, the entire available frequency bands may be considered busy even though a majority of the frequency bands remains idle and may be available.

In the United States, the available frequency bands, which may be used by 802.11ah, are from 902 MHz to 928 MHz. In Korea, the available frequency bands are from 917.5 MHz to 923.5 MHz. In Japan, the available frequency bands are from 916.5 MHz to 927.5 MHz. The total bandwidth available for 802.11ah is 6 MHz to 26 MHz depending on the country code.

Figure 1D:
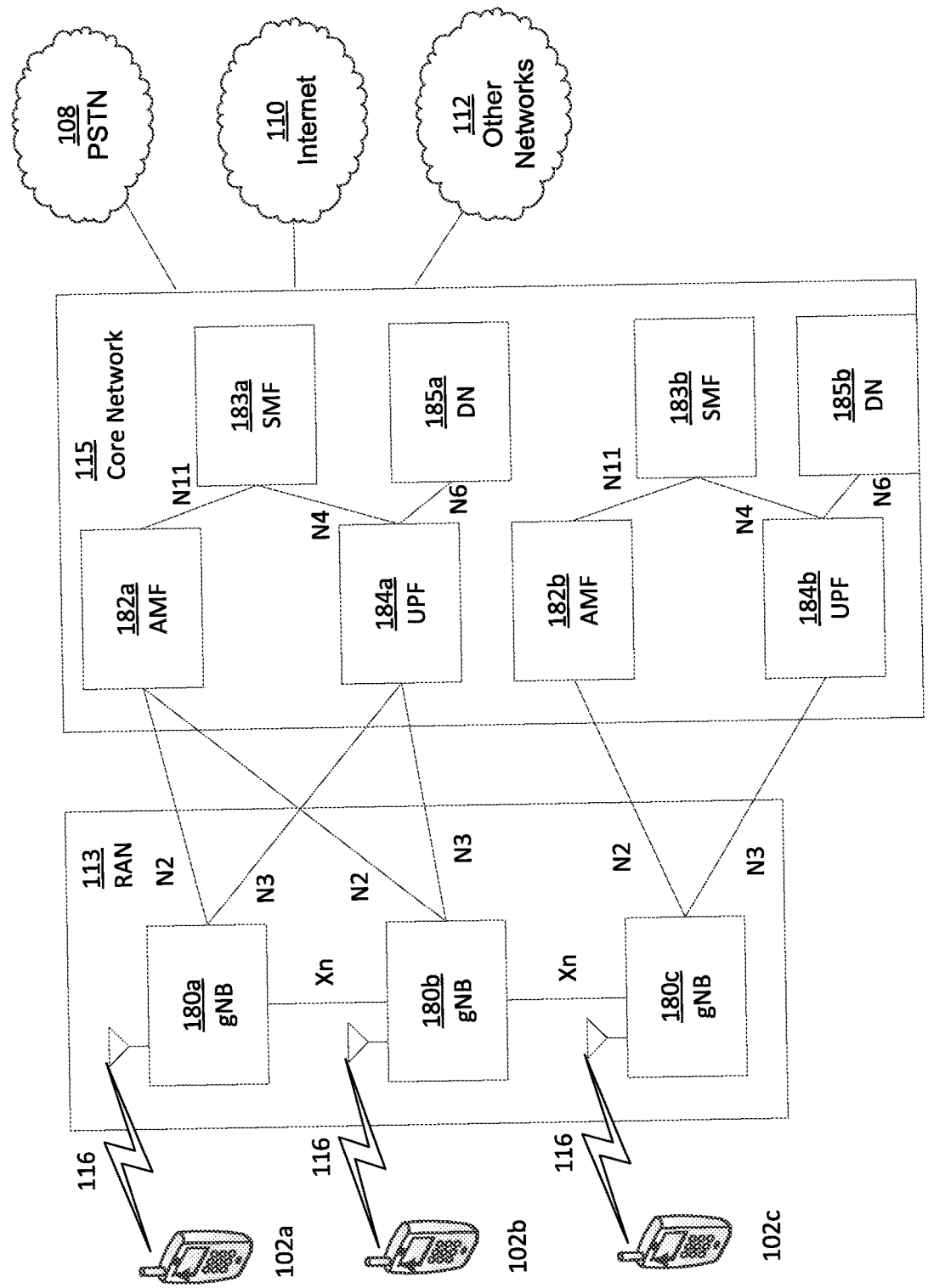
FIG. 1D is a system diagram illustrating a further example RAN and a further example CN that may be used within the communications system illustrated in FIG. 1A according to an embodiment.

FIG. 1D is a system diagram illustrating the RAN 113 and the CN 115 according to an embodiment. As noted above, the RAN 113 may employ an NR radio technology to communicate with the WTRUs 102a, 102b, 102c over the air interface 116. The RAN 113 may also be in communication with the CN 115.

The RAN 113 may include gNBs 180a, 180b, 180c, though it will be appreciated that the RAN 113 may include any number of gNBs while remaining consistent with an embodiment. The gNBs 180a, 180b, 180c may each include one or more transceivers for communicating with the WTRUs 102a, 102b, 102c over the air interface 116. In one embodiment, the gNBs 180a, 180b, 180c may implement MIMO technology. For example, gNBs 180a, 108b may utilize beamforming to transmit signals to and/or receive signals from the gNBs 180a, 180b, 180c. Thus, the gNB 180a, for example, may use multiple antennas to transmit wireless signals to, and/or receive wireless signals from, the WTRU 102a. In an embodiment, the gNBs 180a, 180b, 180c may implement carrier aggregation technology. For example, the gNB 180a may transmit multiple component carriers to the WTRU 102a (not shown). A subset of these component carriers may be on unlicensed spectrum while the remaining component carriers may be on licensed spectrum. In an embodiment, the gNBs 180a, 180b, 180c may implement Coordinated Multi-Point (CoMP) technology. For example, WTRU 102a may receive coordinated transmissions from gNB 180a and gNB 180b (and/or gNB 180c).

The WTRUs 102a, 102b, 102c may communicate with gNBs 180a, 180b, 180c using transmissions associated with a scalable numerology. For example, the OFDM symbol spacing and/or OFDM subcarrier spacing may vary for different transmissions, different cells, and/or different portions of the wireless transmission spectrum. The WTRUs 102a, 102b, 102c may communicate with gNBs 180a, 180b, 180c using subframe or transmission time intervals (TTIs) of various or scalable lengths (e.g., containing varying number of OFDM symbols and/or lasting varying lengths of absolute time).

The gNBs 180a, 180b, 180c may be configured to communicate with the WTRUs 102a, 102b, 102c in a standalone configuration and/or a non-standalone configuration. In the standalone configuration, WTRUs 102a, 102b, 102c may communicate with gNBs 180a, 180b, 180c without also accessing other RANs (e.g., such as eNode-Bs 160a, 160b, 160c). In the standalone configuration, WTRUs 102a, 102b, 102c may utilize one or more of gNBs 180a, 180b, 180c as a mobility anchor point. In the standalone configuration, WTRUs 102a, 102b, 102c may communicate with gNBs 180a, 180b, 180c using signals in an unlicensed band. In a non-standalone configuration WTRUs 102a, 102b, 102c may communicate with/connect to gNBs 180a, 180b, 180c while also communicating with/connecting to another RAN such as eNode-Bs 160a, 160b, 160c. For example, WTRUs 102a, 102b, 102c may implement DC principles to communicate with one or more gNBs 180a, 180b, 180c and one or more eNode-Bs 160a, 160b, 160c substantially simultaneously. In the non-standalone configuration, eNode-Bs 160a, 160b, 160c may serve as a mobility anchor for WTRUs 102a, 102b, 102c and gNBs 180a, 180b, 180c may provide additional coverage and/or throughput for servicing WTRUs 102a, 102b, 102c.

Each of the gNBs 180a, 180b, 180c may be associated with a particular cell (not shown) and may be configured to handle radio resource management decisions, handover decisions, scheduling of users in the UL and/or DL, support of network slicing, dual connectivity, interworking between NR and E-UTRA, routing of user plane data towards User Plane Function (UPF) 184a, 184b, routing of control plane information towards Access and Mobility Management Function (AMF) 182a, 182b and the like. As shown in FIG. 1D, the gNBs 180a, 180b, 180c may communicate with one another over an Xn interface.

The CN 115 shown in FIG. 1D may include at least one AMF 182a, 182b, at least one UPF 184a,184b, at least one Session Management Function (SMF) 183a, 183b, and possibly a Data Network (DN) 185a, 185b. While each of the foregoing elements are depicted as part of the CN 115, it will be appreciated that any of these elements may be owned and/or operated by an entity other than the CN operator.

The AMF 182a, 182b may be connected to one or more of the gNBs 180a, 180b, 180c in the RAN 113 via an N2 interface and may serve as a control node. For example, the AMF 182a, 182b may be responsible for authenticating users of the WTRUs 102a, 102b, 102c, support for network slicing (e.g., handling of different PDU sessions with different requirements), selecting a particular SMF 183a, 183b, management of the registration area, termination of NAS signaling, mobility management, and the like. Network slicing may be used by the AMF 182a, 182b in order to customize CN support for WTRUs 102a, 102b, 102c based on the types of services being utilized WTRUs 102a, 102b, 102c. For example, different network slices may be established for different use cases such as services relying on ultra-reliable low latency (URLLC) access, services relying on enhanced massive mobile broadband (eMBB) access, services for machine type communication (MTC) access, and/or the like. The AMF 162 may provide a control plane function for switching between the RAN 113 and other RANs (not shown) that employ other radio technologies, such as LTE, LTE-A, LTE-A Pro, and/or non-3GPP access technologies such as WiFi.

The SMF 183a, 183b may be connected to an AMF 182a, 182b in the CN 115 via an N11 interface. The SMF 183a, 183b may also be connected to a UPF 184a, 184b in the CN 115 via an N4 interface. The SMF 183a, 183b may select and control the UPF 184a, 184b and configure the routing of traffic through the UPF 184a, 184b. The SMF 183a, 183b may perform other functions, such as managing and allocating UE IP address, managing PDU sessions, controlling policy enforcement and QoS, providing downlink data notifications, and the like. A PDU session type may be IP-based, non-IP based, Ethernet-based, and the like.

The UPF 184a, 184b may be connected to one or more of the gNBs 180a, 180b, 180c in the RAN 113 via an N3 interface, which may provide the WTRUs 102a, 102b, 102c with access to packet-switched networks, such as the Internet 110, to facilitate communications between the WTRUs 102a, 102b, 102c and IP-enabled devices. The UPF 184, 184b may perform other functions, such as routing and forwarding packets, enforcing user plane policies, supporting multi-homed PDU sessions, handling user plane QoS, buffering downlink packets, providing mobility anchoring, and the like.

The CN 115 may facilitate communications with other networks. For example, the CN 115 may include, or may communicate with, an IP gateway (e.g., an IP multimedia subsystem (IMS) server) that serves as an interface between the CN 115 and the PSTN 108. In addition, the CN 115 may provide the WTRUs 102a, 102b, 102c with access to the other networks 112, which may include other wired and/or wireless networks that are owned and/or operated by other service providers. In one embodiment, the WTRUs 102a, 102b, 102c may be connected to a local Data Network (DN) 185a, 185b through the UPF 184a, 184b via the N3 interface to the UPF 184a, 184b and an N6 interface between the UPF 184a, 184b and the DN 185a, 185b.

In view of FIGS. 1A-1D, and the corresponding description of FIGS. 1A-1D, one or more, or all, of the functions described herein with regard to one or more of: WTRU 102a-d, Base Station 114a-b, eNode-B 160a-c, MME 162, SGW 164, PGW 166, gNB 180a-c, AMF 182a-b, UPF 184a-b, SMF 183a-b, DN 185a-b, and/or any other device(s) described herein, may be performed by one or more emulation devices (not shown). The emulation devices may be one or more devices configured to emulate one or more, or all, of the functions described herein. For example, the emulation devices may be used to test other devices and/or to simulate network and/or WTRU functions.

The emulation devices may be designed to implement one or more tests of other devices in a lab environment and/or in an operator network environment. For example, the one or more emulation devices may perform the one or more, or all, functions while being fully or partially implemented and/or deployed as part of a wired and/or wireless communication network in order to test other devices within the communication network. The one or more emulation devices may perform the one or more, or all, functions while being temporarily implemented/deployed as part of a wired and/or wireless communication network. The emulation device may be directly coupled to another device for purposes of testing and/or may performing testing using over-the-air wireless communications.

The one or more emulation devices may perform the one or more, including all, functions while not being implemented/deployed as part of a wired and/or wireless communication network. For example, the emulation devices may be utilized in a testing scenario in a testing laboratory and/or a non-deployed (e.g., testing) wired and/or wireless communication network in order to implement testing of one or more components. The one or more emulation devices may be test equipment. Direct RF coupling and/or wireless communications via RF circuitry (e.g., which may include one or more antennas) may be used by the emulation devices to transmit and/or receive data.

One or more of the features disclosed herein may be implemented using one or more of the devices, methods, and/or systems described in FIGS. 1A-1D.

In addition to the coding schemes, for example, turbo coding and low-density parity check (LDPC) coding, polar coding may be used to encode control information and/or data. A polar code may provide unique features in encoding and decoding and code construction, for example, compared to other channel coding schemes such as turbo code and LDPC code.

A polar code may be expressed, for example, in accordance with Eq. 1:

$$x_0^{N-1} = u_0^{N-1} G_N,\qquad \text{Eq. 1}$$

where $u_0^{N-1}$ may be a vector of an input block and $x_0^{N-1}$ may be a vector of an output code block. The two vectors may have the same length of N (e.g., index from 0 to N−1, N=$2^n$). One or more bits in an input block may be set to a fixed value (e.g., 0). The positions of bits with a fixed value may be represented by a set Ac. The positions of information bits with variable binary values may be denoted by a set A.

$G_N$ may be a generator matrix. The generator matrix $G_N$ may be expressed, for example, in accordance with Eq. 2:

$$G_N = B_N F^{\otimes n} \qquad \text{Eq. 2}$$

where $B_N$ may be a bit reversing matrix. Operation of bit reversing for an input vector may be performed, for example, by product operation. Using bit reversing on bits "001" for example, the bits may be transformed to "100.". $F^{\otimes n}$ may be an n-th kronecker product of F. F may be expressed, for example, in accordance with Eq. 3:

$$F = \begin{bmatrix} 1 & 0 \\ 1 & 1 \end{bmatrix},\ F^{\otimes 2} = F \otimes F = \begin{bmatrix} F & 0 \\ F & F \end{bmatrix} = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \qquad \text{Eq. 3}$$

Figure 2:
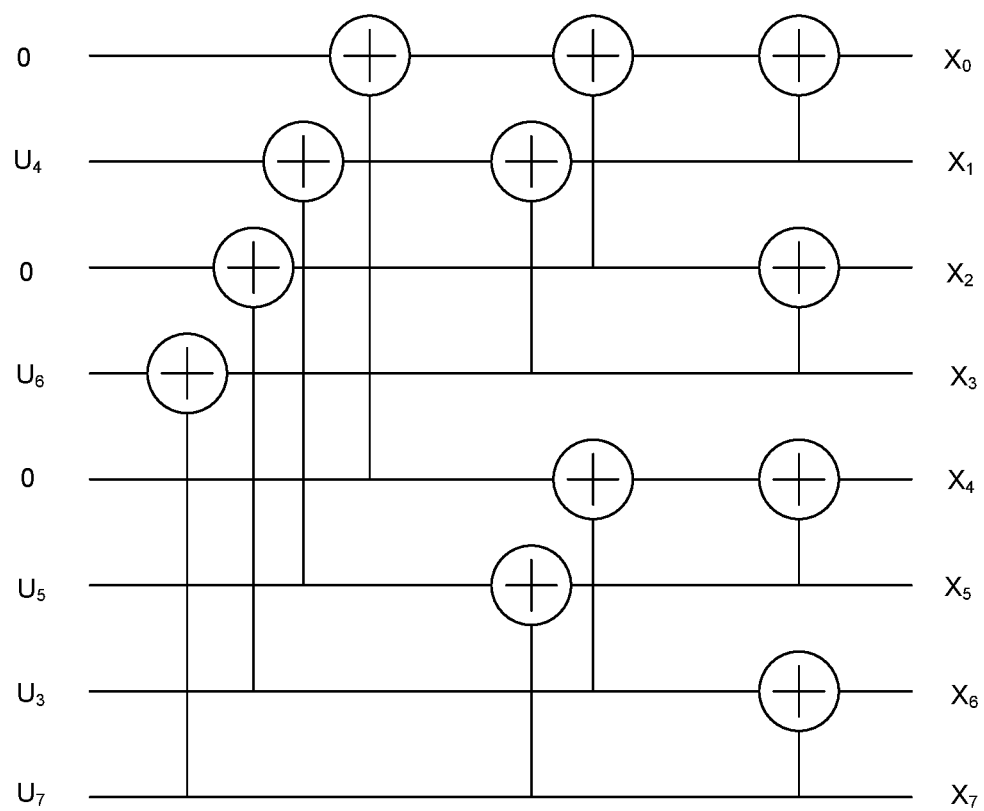
FIG. 2 illustrates an exemplary polar encoder.

FIG. 2 illustrates an example of a polar code. In an example, a polar code may be configured without bit reversing at the encoder. For example, $G_N$ may be a generator matrix that may be expressed, for example, in accordance with Eq. 4:

$$G_N = F^{\otimes n} \qquad \text{Eq. 4}$$

An order of inputs may be changed, for example, compared to the inclusion of a bit reversing matrix.

In an example, the parameters for a polar code may be (N,K,A)=(8,5,{3,4,5,6,7}). Five bits, e.g., $u_4$, $u_6$, $u_5$, $u_3$, $u_7$ may be the input bits. The index order of the input bit sequence may change, for example, due to a bit reversing operation, such as from {3,4,5,6,7} to {6,1,5,3,7}. Eight bits, e.g., $x_0$, $x_1$, ..., $x_7$ may represent to be output from a polar encoder. Bit positions of $A^c$={0,1,2} may have a fixed value of 0, for example, because A={3,4,5,6,7}. The code rate of this code may be R=5/8.

The set $A^c$ with fixed values may be referred to as frozen bits. Set A may be referred to as unfrozen bits or information bits. A code construction of a polar code may determine the positions of frozen bits. In an example, the least reliable N−K bits of input bits may be selected to be frozen bits.

Polar code construction may be implemented using one or more procedures. In an example, code construction may be implemented using Bhattacharyya bounds. Bhattacharyya bounds code construction may be simple, for example, relative to other code construction procedures. Bhattacharyya may not apply to certain channel conditions. Bhattacharyya bounds code construction may provide sufficient performance, for example, for medium size N (e.g., of several thousand bits).

Figure 3:
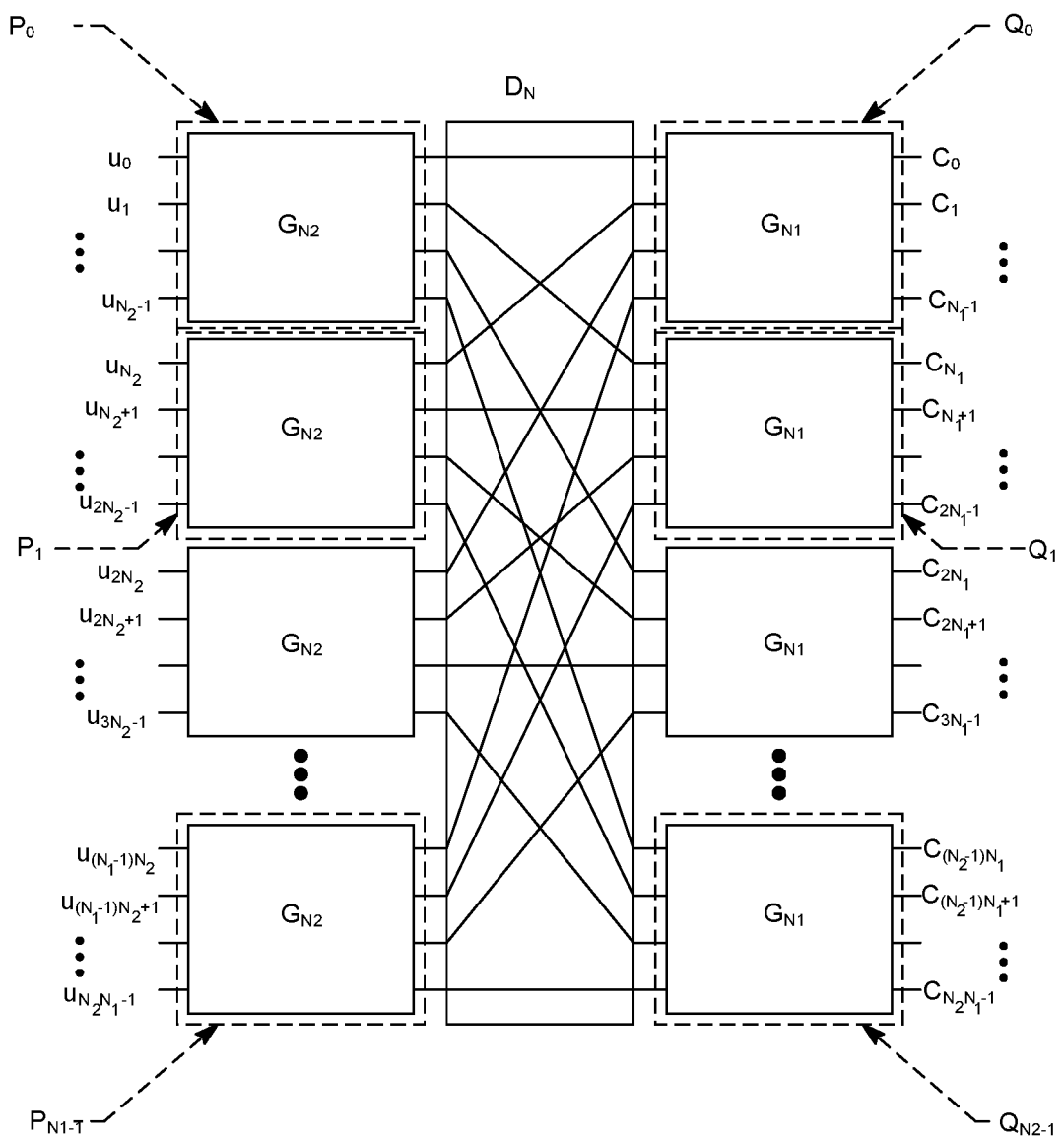
FIG. 3 illustrates an example of decomposition of a generator matrix, $G_N$.

FIG. 3 illustrates an exemplary decomposition of $G_N$. A generating matrix may be expressed, for example, in accordance with Eq. 5:

$$G_N = (I_{N_1} \otimes G_{N_2}) D_N (I_{N_2} \otimes G_{N_1}) \qquad \text{Eq. 5}$$

where, for example, $N_1 = 2^{n_1}$, $N_2 = 2^{n-n_1}$ and $N=2^n$, $I_a$ may be an a×a identity matrix, $G_{N_1} = B_{N_1} F_2^{\otimes n_1}$, $G_{N_2} = B_{N_2} F_2^{\otimes (n-n_1)}$ and $D_N$ may be a permutation matrix that may map a vector ($a_0$, $a_1$, ..., $a_{N-1}$) into, for example:

($a_0$, $a_{N_2}$, $a_{2N_2}$, ..., $a_{(N_1-1)N_2}$, $a_1$, $a_{N_2+1}$, $a_{2N_2+1}$, ..., $a_{(N_1-1)N_2+1}$, ..., $a_{N_2-1}$, $a_{2N_2-1}$, ..., $a_{N-1}$).

$G_N$ may be decomposed into a form expressed by $G_{N_1}$ and $G_{N_2}$. $G_{N_1}$ and $G_{N_2}$ may be generator matrices of polar code with smaller block size of $N_1$ and $N_2$ than N. A polar code may be a concatenated code by inner and outer code. For example, they may be interpreted as: (1) Inner codes, e.g., $N_2$ polar codes of length $N_1$ and (2) Outer codes, e.g., $N_1$ linear block codes of length $N_2$. In an example, an inner code and outer code may have the same form of basic polar code structure, and may be decoded by the same type of decoding procedure as a polar code.

Multi-stage decoding may be provided for polar codes. A decoding procedure with less complexity, for example, as compared to a successive cancellation (SC) decoding may be implemented. Such a decoding procedure may be implemented by utilizing the property of decomposition in polar codes. Decoding may be implemented based on decoding a concatenated code, for example, when polar codes are considered as a concatenation of inner codes and outer codes. Decoding outer codes of length $N_2$ may be performed, for example, after decoding inner codes of length $N_1$. As illustrated in FIG. 3, $P_i$ may be defined as i-th encoder of outer code $I_{N_1} \otimes G_{N_2}$. $Q_j$ may be defined as j-th encoder of inner code $I_{N_2} \otimes G_{N_1}$, where i=0, 1, . . . , $N_1-1$ and j=0, 1, . . . , $N_2-1$.

Figure 4:
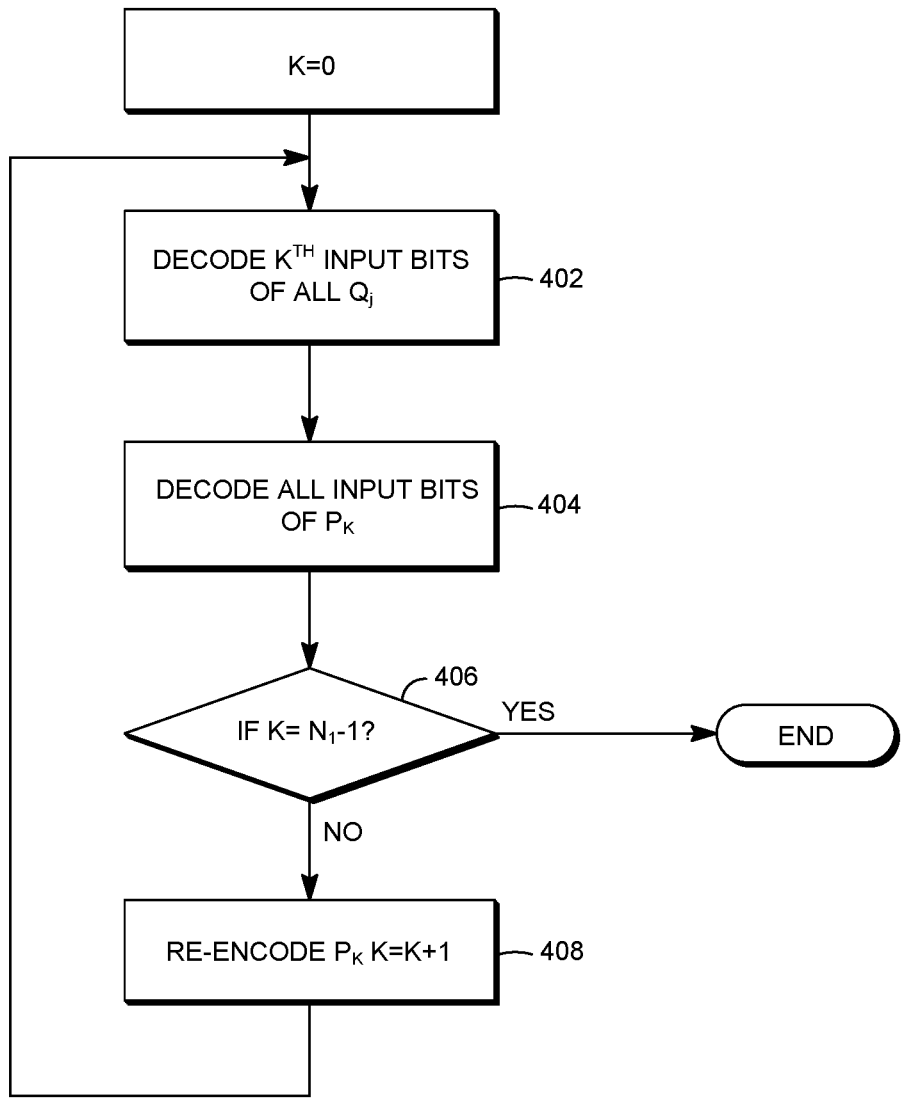
FIG. 4 illustrates an example of multi-stage polar decoding.

FIG. 4 illustrates an example of multi-stage decoding. As illustrated in FIG. 4, at 402 a likelihood or log-likelihood of the first input bit of each of the coded block $Q_j$ may be decoded and/or calculated. At 404, the kth input bits of each of the $Q_j$ may be used as input bits to decode $P_k$.

As further illustrated in FIG. 4, for k-th stage (e.g., starting with k=0), the decoded input bits from 0 stage to k−1 stage may be re-encoded. At 408, the re-encoding may be performed after the likelihood or log-likelihood of the first input bit of coded block $Q_j$ is calculated at 402, and/or the input bits of $P_0$ are decoded at 404. At 406, a check may be performed whether each of the bits belonging to the $P_0$ have been decoded. The re-encoded bits may be used to calculate the next likelihood or log-likelihood from $Q_j$ to have the k-th input bits. In a k-th stage, $P_0, \ldots, P_{k-1}$ may be decoded and re-encoded and may be used for 0~(k−1)-th input bits of $Q_j$.

Re-encoded bits from previous stages may be used to improve a performance of decoding $Q_j$ (j=0, 1, . . . , $N_2-1$) to have current k-th inputs bit. A likelihood probability or log-likelihood value of input bits for $Q_j$ may be provided by a decoding procedure (e.g., SC decoding or ML decoding (maximum likelihood decoding)). Decoded bits of a previous stage may have errors. Errors may affect decoding of a next stage, and may propagate errors. Error propagations from previous stages may be prevented or reduced, for example, by making error performance of earlier stages better than error performance in later stages.

Joint SC decoding may be provided for polar codes. For example, a polar code may be combined with spectrally efficient modulation, and a bit-interleaver between a mapper and a polar encoder. m bits of interleaved polar coded bits may be mapped to single symbol to be transmitted to a channel, for example, when $M=2^m$-ary modulation is applied. An interleaving range of a bit-interleaver may be limited to the length of inner polar code, $N_1$, for example, to improve performance. $N_1$ may or may not be larger than modulation order m.

Likelihood probabilities or log likelihood values may be calculated (e.g., bit by bit calculated) from a demapper, for example, in an initial stage of polar decoding. SC decoding with initialized values bit by bit from a demapper may be referred to as parallel decoding. Performance of polar codes may be improved, for example, by introducing a combined operation of a demapper unit and a deinterleaving unit. By adopting joint SC decoding for example, an effect of correlation between coded bits may be ignored. This may result in a performance improvement in an additive white gaussian noise (AWGN) channel.

In an example where $N_1=m$, likelihood probabilities of inner encoded bits for $Q_j$ may be decoded (e.g., directly decoded) or calculated from a single channel symbol, for example, in contrast to bit by bit processing for each encoded bit. A complexity of parallel decoding may be indicated by $O(N \cdot 2^m) + O(N \log N)$. A complexity of joint SC decoding may be indicated by $$O(N \cdot 2^{N_1}) + O\left(N \log \frac{N}{N_1}\right).$$

Joint SC decoding may have less complexity, for example, if $N_1=m$.

Figure 5:
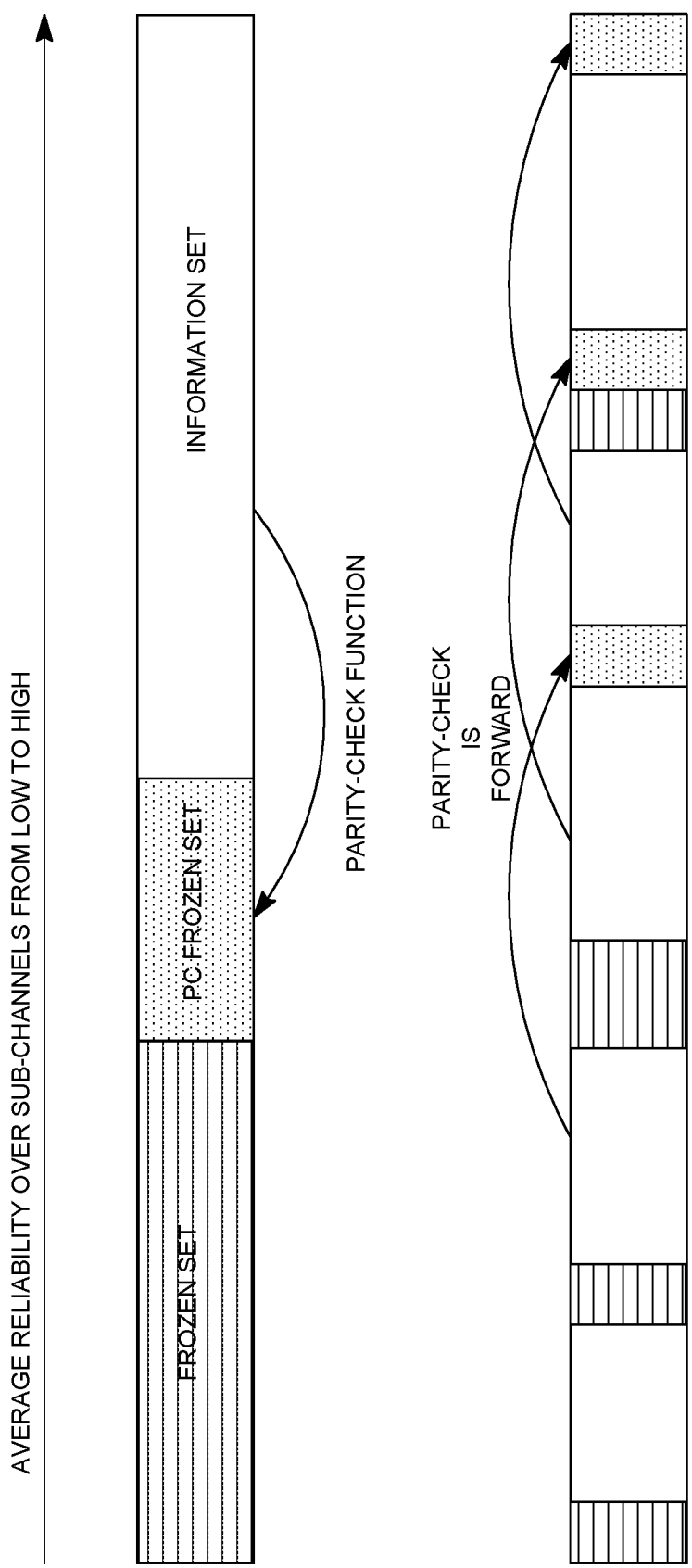
FIG. 5 illustrates an example of a parity-check (PC) polar coding.

FIG. 5 illustrates an example of a parity-check (PC) polar coding. As illustrated in FIG. 5, in PC-polar coding, a subset of a frozen sub-channels may be selected as PC-frozen sub-channels. A PC function may be used for error correction over sub-channels. In an example (e.g., at each parity check sub-channel position), decoded bits involved in a PC function over a PC-frozen sub-channel may help prune a list decoding tree. In an example, one or more paths that meet a PC-function may survive while the rest may be eliminated. The rest may be eliminated on the fly. As illustrated in FIG. 5, a PC function may be established as forward-only, for example, to be consistent with a successive cancellation-based decoder.

Unequal Error Protection (UEP) may be applied in a wireless communication system. An example may be Uplink Control Information (UCI) transmission over physical uplink shared channel (PUSCH). Uplink control information (e.g. ACK/NACK, Rank Indicator (RI) and Channel State Information (CSI)) may be transmitted to a base station with an independent channel coding scheme. Distinct allocations of error correction for each UCI may improve the efficiency of a limited uplink resource (e.g., instead of using similar error protection for each of the UCI types).

In new radio (NR) multiple access (MA), for example, autonomous/grant-free/contention may be used to transmit uplink information to a base station. Control information associated with uplink transmission may include, for example, UCI and/or user identification information (e.g., for user differentiation). Control information associated with downlink transmission may include, for example, ACK/NACK information.

Unequal error protection may be based on, for example, using a distinct coding scheme for each information category. Types of information bits may include control information and data. The control information and data may be concatenated. Unequal error capability may be imposed on each information type by a single coding approach. Imposing such an error capability may be referred to as embedded unequal error protection.

Embedded unequal error protection may provide one or more benefits. A dedicated or additional encoder and decoder for control information may be unnecessary. Implementation in the base station and user equipment may be improved or simplified. Embedded unequal error protection may improve performance, for example, by increasing block size. Block length for separate coding of control information may be smaller than the block length for embedded unequal error protection. Some coding schemes (e.g., turbo code, polar code, LDPC code and other codes) may provide improved performance for larger block sizes. Control information transmission using embedded unequal error protection may provide a better trade-off between performance and complexity, for example, for large control information bit blocks.

Multi stage DCI (e.g., a two-stage DCI) may be provided to signal downlink control information to a WTRU. Time critical control information may be required to be be delivered faster than control information that may not be time critical. Time critical control information may be delivered using a first DCI, and the non-critical control information may be conveyed using a second DCI. A two stage DCI may be configured, for example, so that a second DCI is configurable. In an example, a second DCI may be configured when a resource available for a single DCI may not be enough, e.g., such that additional allocation of resources may be provided for transmitting the remaining part of the DCI.

Downlink control information contents may be divided for a two stage DCI. In an example, a total DCI may be divided into a two stage DCI. For example, there may be a time critical DCI and a non-time critical DCI. Non-time critical DCI content may include, for example, new data indication (NDI), a redundancy version (RV), and a modulation and coding scheme (MCS). UCI may be included, for example, in first DCI or second DCI. UCI related control information may include, for example, resource allocation and/or timing of ACK/NACK. Precoding control information may be provided in first DCI or second DCI. Precoding control information may include, for example, wideband precoding information and/or subband precoding information. Performance of a downlink control channel may be improved, for example, based on decomposition of a polar code.

Coded bits (e.g., after channel encoding) may be rate-matched to adapt a code rate to a channel condition and/or to a predetermined size. A rate-matching algorithm may include repetition. For example, a part of coded bits may be repeated to reduce a code rate or to increase a coded block size. A lower code rate may be acquired by repetition for a fixed mother code rate (e.g., in the channel codes such as turbo code or tail-biting convolutional code (TBCC)).

In polar coding, a mother code rate may not be used as in other channel codes. In polar coding, rate-matching may be performed by changing the size of input bits (K) or the size of coded bits by puncturing, for example, when the block size (N) larger than the final size may be assumed. A maximum value of N may be fixed, for example, based on a limitation of allowable complexity in a system and/or consideration of an actual range of usage in a code rate domain. Repetition may be used for a block size larger than a maximum N. A polar code may have a unique structure for encoding and decoding. The use repetition patter as adopted by other channel codes may not provide optimized performance. Improved design using the properties of polar coding may be provided.

Figure 6:
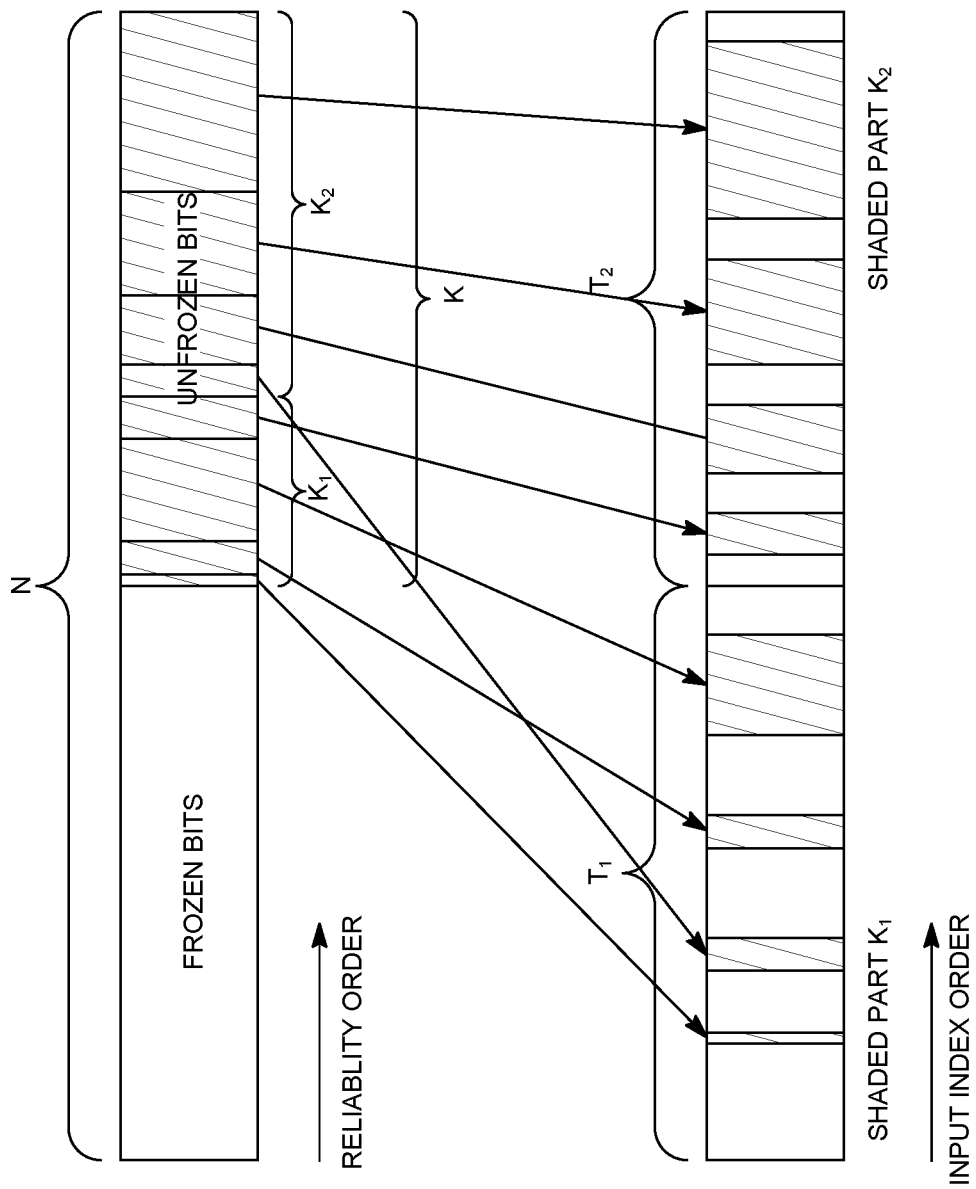
FIG. 6 illustrates an example of a set configuration that may be used to provide unequal protection (UEP) of control information.

Unequal protection of control information may be provided. Unequal protection may be provided, for example, by multilevel decomposition FIG. 6 illustrates an example of unequal protection in case of two sets. In FIG. 6, a reliability rank function r(i) may be defined as r(i), i=0, 1, ..., N−1. after code construction. The reliability rank function r(i) may indicate a reliability rank of an i-th input bit. In an example where r(10)=26 and N=128, the 11-th bit may be the 27-th most reliable bit among 128 input bits. The inverse function of r(i) may be denoted as p(j). The inverse function p(j) may indicate the input index for a (e.g. each) reliability rank. The inverse function p(j) may denote an input index that may be sorted in terms of reliability. A selection of frozen bits may be performed, for example, by selecting bits having input index p(j), e.g., where $0 \leq j < N-K$. The least reliable N−K bits may be frozen bits. The remaining (e.g., most reliable) K bits with input bit index p(j), e.g., $N-K \leq j < N$, may be the unfrozen bits. The unfrozen bits may be allocated for input information bits.

Unequal protection using polar codes may be achieved, for example, by dividing the total input bits of a polar encoder into several sets. A decoding operation (e.g., in a polar decoder) for each of the subsets may be performed. The decoding operation may be performed on a per-set basis. Input bits may be divided using one or more of the approaches described herein.

In an example, input bits may be divided based on a gradual input index. For example, for V sets of UEP level, the input index 0~N−1 may be divided into V sets, such as $\{0, 1, \ldots, T_0-1\}$, $\{T_0, T_0+1, \ldots, T_0+T_1-1\}, \ldots, \{\Sigma_{v=0}^{V-2} T_v, \ldots, \Sigma_{v=0}^{V-1} T_v\}$. The number of elements for the v-th set may be $N_v$. In an example, $T_0 = \ldots = T_{V-1} = N/V$, for example, when each of sets has equal elements.

In an example, input bits may be divided based on a gradual reliability rank. In this example, various sets may be formed based on the reliability domain instead of input index. The input bits of a polar code in this case may be divided as $\{p(0), p(1), \ldots, p(T_0-1)\}$, $\{p(T_0), p(T_0+1), \ldots, p(T_0+T_1-1)\}, \ldots, \{p(\Sigma_{v=0}^{V-2} T_v), \ldots, p(\Sigma_{v=0}^{V-1} T_v)\}$.

In an example, input bits may be divided based on a non-gradual approach. For input index domain and reliability rank domain, every V-th element may be selected with offset to configure a set. In an example, when V=2, even input indexes may be comprise one set, and odd input indexes may comprise another set. For example, an even index set may have a zero offset and an odd index set may have an offset value of one.

In examples, $p_v(j)$ may be defined for each set. $p_v(j)$ may indicate a position of a j-th reliable bit within a v-th set. Frozen bits may be determined, for example, by selecting $T_v-K_v$ bits. $R_v=K_v/T_v$ may be defined as an effective code rate for a v-th set. A level of unequal protection may be controlled, for example, by changing the effective code rate. A lower effective code rate may have a higher capability of error protection compared to a capability of error protection for a higher effective code rate.

FIG. 6 illustrates an example of UEP with V=2, when a gradual input index based set configuration is used. As described herein, various approaches may be adopted to decide frozen bits for each of the sets, for example, when using a gradual input index set configuration.

In first approach, without considering UEP, for example, frozen bits may be selected based on reliabilities of overall inputs bits. For example, least reliable N−K bits may be selected as frozen bits. Frozen bits for each set may be decided. For example, after selection of frozen bits based on overall reliabilities without consideration of UEP, the frozen bits of each set may be decided. $K_v$ may be set to a certain value for a v-th set. The code rate of the v-th set may be decided as $R_v=K_v/T_v$. In an example, a code rate may not be adjusted arbitrarily. The code rate may depend on code construction and configuration of reliabilities for input bits. The value of $T_v$ may be changed, for example, after puncturing. The value of $T_v$ may be defined as a sum of frozen bits and unfrozen bits until $K_v$ bits are reached.

In second approach, for example, for each set, least reliable $T_v-K_v$ may be selected as frozen bits. A code rate may be adjusted arbitrarily. The two approaches described herein may be implemented together. For example, the second approach may be applied after or before the first approach.

In case of puncturing polar code, the first approach adopted to decide frozen bits, as described herein, may provide benefits. A variety of puncturing algorithms may be used to puncture a polar code. In an example, the reliabilities of input bits for polar code may be changed after puncturing. The polar code may be changed irrespective of the puncturing algorithm used. A change of reliabilities and corresponding change of frozen bits may influence a code rate, $R_v = K_v/N_v$. In an example, the code rate of each of the sets may be adjusted for the first approach. An algorithm for selecting $N_v$ may be implemented, for example, for the second approach. The second approach may provide more optimized and delicate control after puncturing.

In an example with $T_v = N_2$, the structure of decomposition in polar code may be combined with UEP. For each input bit block with the size of $N_2$, an independent code construction may be configured and the code rate of each block may be adjusted.

Figure 7:
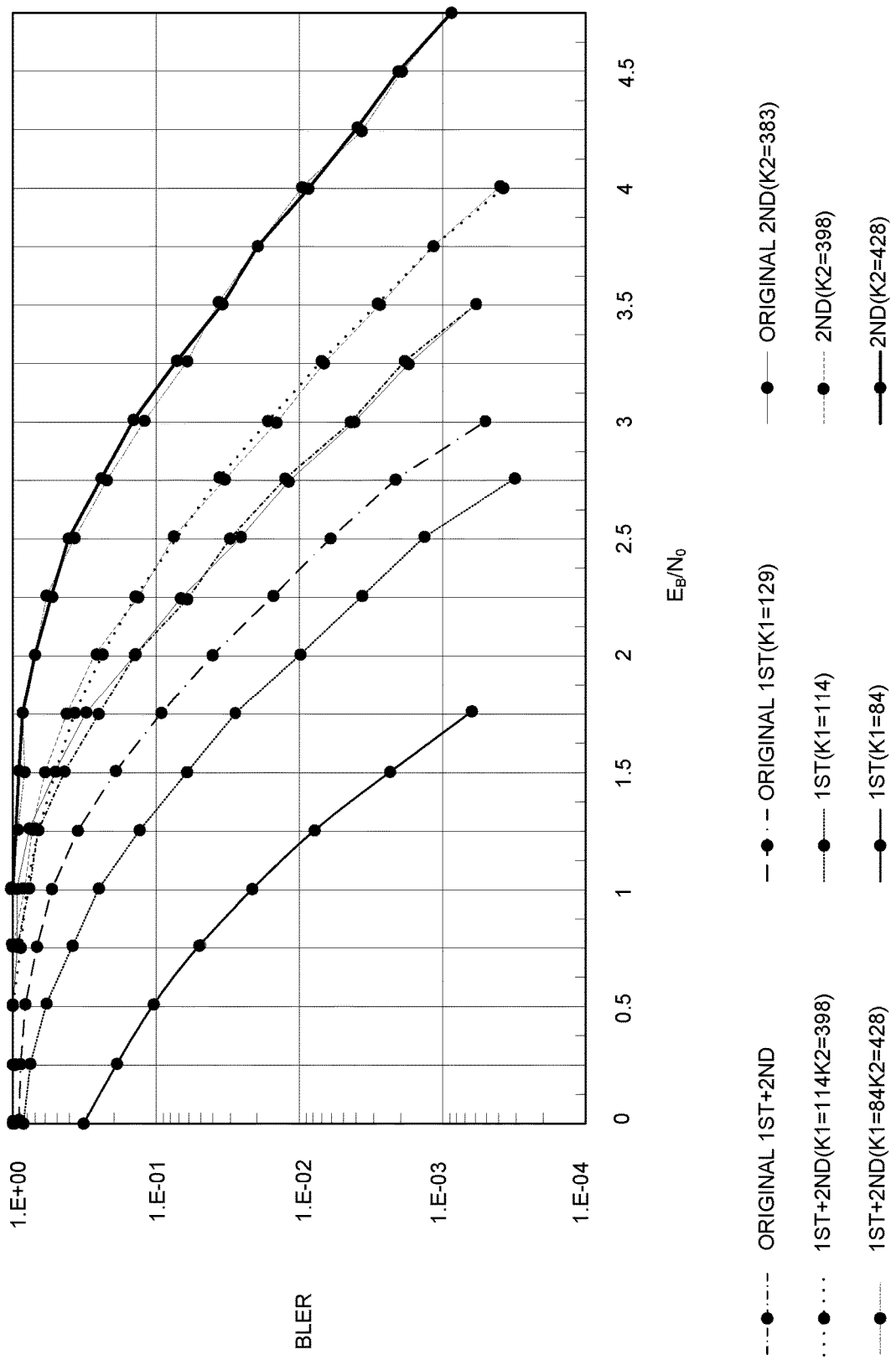
FIG. 7 illustrates simulation results of block error ratio (BLER) performance of UEP using polar coding scheme as described herein.

FIG. 7 illustrates BLER performance of UEP. Examples of UEP performance for various implementations illustrated in FIG. 7. Examples are based on a gradual input index based set construction and a code rate based on the first example approach. Table 1 provides simulation conditions for examples shown in FIG. 7.

TABLE 1

| | Polar code |
|---|---|
| (N, K) | (1024, 512) |
| Code construction | Bhattacharyya bound method |
| Design SNR | 0 dB |
| Decoding algorithm | SC (Successive Cancellation) decoding |
| Interleaver | Random bit interleaver |
| Modulation | BPSK |
| Channel | AWGN |
| Set configuration | $1^{st}$ set: $N_1 = 512$, $K_1 = 129, 114, 84$ |
| | $2^{nd}$ set: $N_2 = 512$, $K_2 = 383, 398, 428$ |

In an example (e.g., without UEP), the effective code rate in a first set $\{0, \ldots, 511\}$ may be $129/512(K_1=129, T_1=512)$, which may be derived from the result of code construction, for example, using Bhattacharyya modeling. The effective code rate in a second set $\{512, \ldots, 1023\}$ may be derived as $383/512(K_2=383, T_2=512)$. Unequal BLER performance may exist between the first set and the second set. The unequal performance may be between the first set and the second set, due to the polar code design so that the reliability of bits may increase as the bit index increases, and a smaller number of reliable bits may satisfy a threshold in the first set. In an example, the effective code rates may be set (e.g., based on a UEP procedure) to parameters such as ($K_1=114$, $T_1=512$ and $K_2=398$, $T_2=512$) or ($K_1=84$, $T_1=512$ and $K_2=428$, $T_2=512$). Unequal error capability may be controlled while keeping an overall code rate constant (e.g., at ½).

Control information may be multiplexed with data. uplink data packet and uplink control information may be multiplexed, for example, when an uplink data packet or an uplink frame comprises control information including, for example, ACK/NACK or CSI or MIMO related feedback information. ACK/ANCK and RI may require error protection with higher reliability than other feedback information, for example. ACK/ANCK and RI, therefore, may be placed in parts of a polar coded packet or frame (e.g., in input bits domain) having higher reliable error protection, for example, where the part with higher reliability has the polar code structure as illustrated in FIG. 2 is used.

Figure 8:
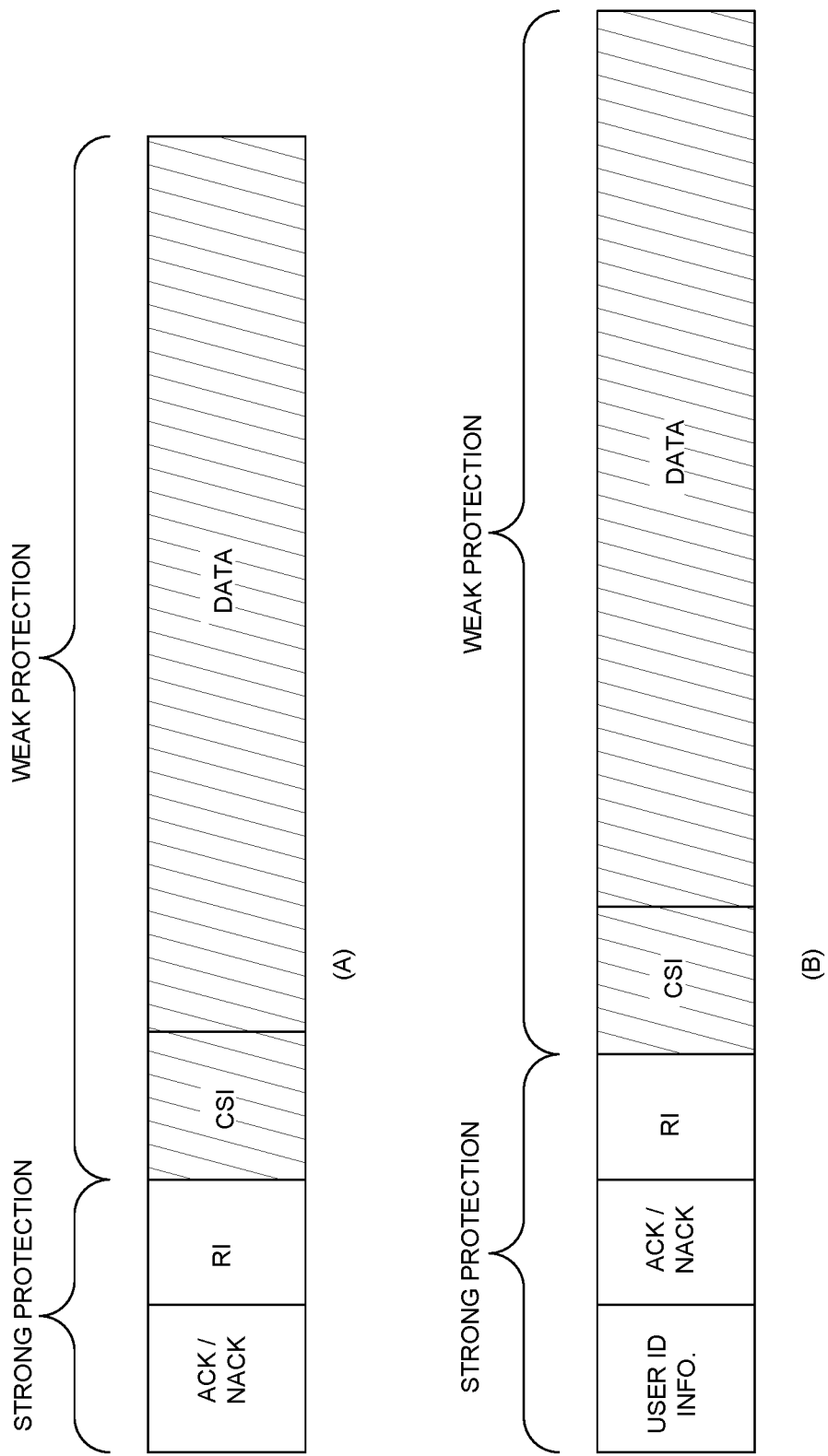
FIG. 8 illustrates an example of information bit allocation for UEP.

FIG. 8 is an example of information bit allocation for UEP. As illustrated in FIG. 8 (a), bits corresponding to an ACK/NACK or an RI may be positioned in strong protection part in a polar coded packet or frame. CSI may be placed adjacent to data, for example, when CSI does not require higher or equal reliability than ACK/NACK or RI.

As illustrated in FIG. 8(b), user identification information (e.g., radio network temporary identifier (RNTI)) may be positioned adjacent to other control information with high reliability, such as ACK/NACK or RI. This arrangement may be used, for example, when all or part of user identification information may be conveyed with the data. For example, when WTRU ID (or RNTI) may be included in a grant free uplink transmission for uplink data. The WTRU ID may be included in a part polar encoded packet or frame with strong protection.

BLER performance of a part of a polar code that is decoded first may better than the part that is decoded later. This may be because of less reliance on genie information when first part is decoded. A successive cancellation (SC) decoding may, for example, assume that values for previously decoded bits (e.g., before decoding a current bit) have been successfully decoded and there are no errors. These previously decoded bits that are assumed successful may be considered as known preliminary information or genie information. A first unfrozen bit in polar coding, for example, may have the best decoding performance with SC decoding. The first unfrozen bit, therefore, may be used for information to be conveyed with higher reliability, e.g., ACK/NACK information.

In an example of downlink multiple access (MA), ACK/NACK for uplink data may be included in the downlink data transmission. Downlink ACK/NACK information under polar coding may be positioned in the first unfrozen bit (or the beginning part) of the input information bits.

WTRU ID may be included in or used with polar code frozen bits for DCI coding. Cyclic redundancy check (CRC) parity bits for a PDCCH channel may be scrambled with WTRU ID (e.g. C-RNTI), for example, while using tail-biting convolutional code (TBCC) for coding. The use of WTRU ID may be used, for example, to reduce false alarm rate. The WTRU ID may be used, for example, when using polar coding to encode or decode DCI.

In an example, a WTRU ID may be included in or used with a frozen set of polar codes. A subset of a frozen set of polar codes may have non-zero values. One or more bits known to both an encoder and a decoder may be used as frozen bits. For example, a WTRU ID that may be known to an eNB and a WTRU may be designated as frozen bits. All or part of a WTRU ID may be included in or used as frozen bits. The use of WTRU ID may be used to reduce false alarm rate, for example, because each of the WTRU IDs may be unique. With a unique WTRU ID, DCI information may be decoded by the WTRU having the relevant WTRU ID or relevant frozen bits. A WTRU ID may be scrambled with original frozen bits of a polar code.

Figure 9:
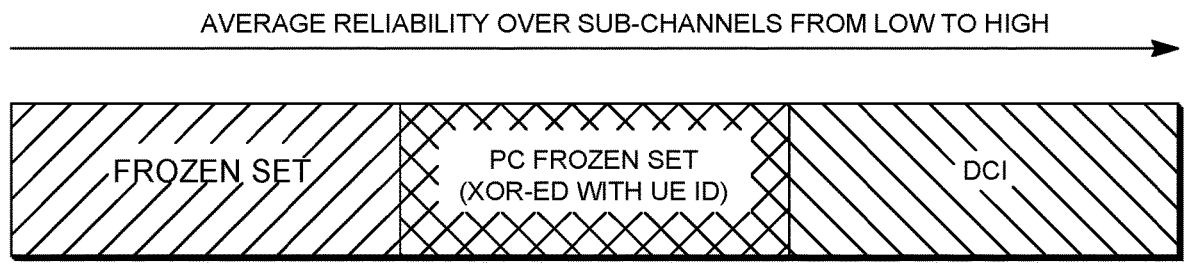
FIG. 9 illustrates an example of downlink control information (DCI) encoded by a PC polar encoder.

The scheme of including WTRU ID as a part of frozen bits may be applied to parity-check (PC) polar coding. PC frozen bits in a PC polar code may be derived from the information bits. For example, the PC polar code may be masked with a WTRU ID associated with a WTRU. The original PC frozen bits may be XOR-ed with a WTRU ID. The WTRU ID may be used to scramble original PC frozen bits. The WTRU ID may be used, for example, to reduce a false alarm rate of a DCI message associated with a WTRU. FIG. 9 is an example of DCI encoded by a PC polar code. As illustrated in FIG. 9, PC frozen bits may be XOR-ed with a WTRU ID.

Different bit channels associated with a polar encoder and/or a polar decoder may be used to carry several types of data or traffic. As illustrated in various figures herein, several types of data or traffic may be mapped to bit channels with appropriate reliability level(s).

Multi stage (e.g., two stage) DCI may be implemented. For example, a two stage DCI may be implemented using multi-level decomposition. In an example, decomposition may be configured, for example, when $$N_1 = \frac{N}{2} = 2^{n-1}$$

and $N_2=2$.

Figure 10:
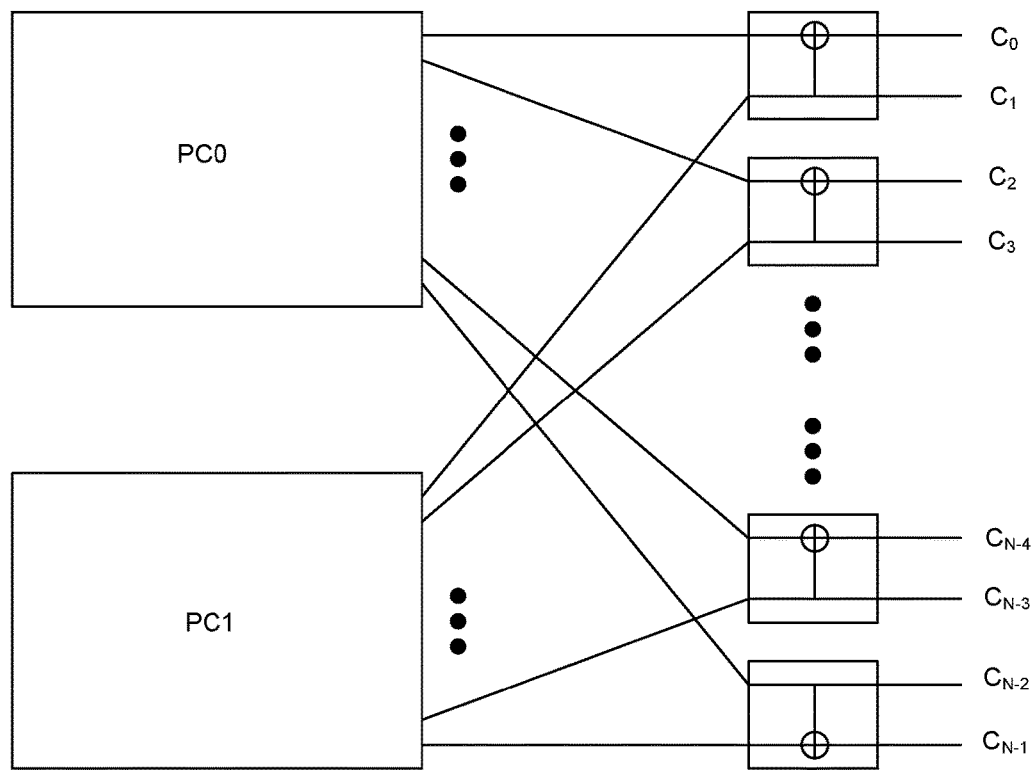
FIG. 10 illustrates an exemplary encoder structure for a polar coded two stage DCI.

FIG. 10 illustrates an exemplary encoder structure of a polar coded two stage DCI. In an example, PC1 may be an independent polar encoder with independent code construction. PC1 may be associated with PC0, for example, by a base kernel matrix. PC1 may have independent decoding without considering PC0. PC0 may be an independent polar encoder with independent code construction, for example, when an association with PC0 may not be included in a decoding process. In an example, log-likelihood (LL) values from PC1 may be used to decode PC0.

In an example, a first DCI may be encoded by PC1 and a second DCI may be encoded by PC0. The number of input bits in PC1 may be $K_1$, which may be different from the number of input bits $K_0$ in PC0. PC1 encoded bits, e.g., $c_1$, $c_3$, ..., $c_{N-3}$, $c_{N-1}$ may be interleaved and mapped to a modulation symbol for further baseband processing. This may be referred to as a first control channel. The PC0 bits part (encoded by PC0 and combined with PC1 by XOR operation), e.g., $c_0$, $c_2$, ..., $c_{N-4}$, $c_{N-2}$ may be interleaved and mapped to a modulation symbol for further baseband processing. This may be referred to as a second control channel. In an example, the first control channel and the second control channel may convey separate DCIs. The first control channel may convey a first DCI, and a second control channel may convey a second DCI. The control information may be transmitted and received in separate and/or unique time/frequency/spatial/beam domains. A variety of indexing procedures may be used. In an example, indexing for PC1 encoded bits may be denoted as $c_{N/2}$, $$c_{\frac{N}{2}+1}, \ldots ,$$

$c_{N-2}$, $c_{N-1}$ and indexing for PC0 part bits may be denoted as $c_0, c_1, \ldots ,$ $$c_{\frac{N}{2}-2}, c_{\frac{N}{2}-1},$$

when a bit reversing matrix may not be applied.

Figure 11:
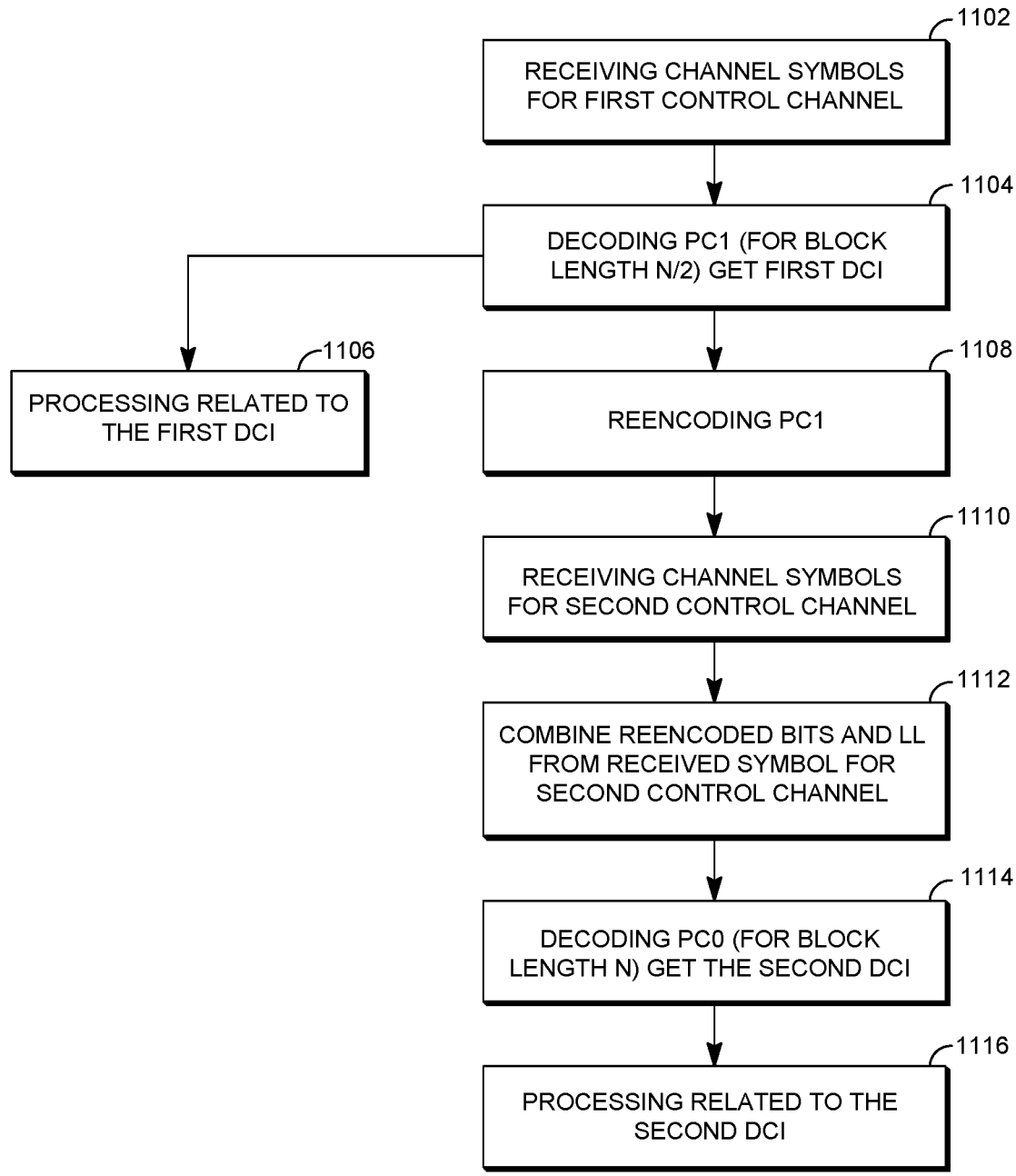
FIG. 11 illustrates an example of multi-stage decoding for a multi-stage DCI.

FIG. 11 illustrates an example of multi-stage decoding for a multi-stage DCI. FIG. 11 shows an example of a decoding process for a two stage DCI. As illustrated in FIG. 11, at 1102, a WTRU may receive channel symbols associated with a first control channel. At 1104, the WTRU may decode the received symbols associated with the first control channel to obtain a first DCI. At 1106, the WTRU may process and/or execute a procedure for the first DCI. At 1108, the decoded first DCI may be re-encoded. At 1110, the WTRU may receive channel symbols associated with a second control channel. At 1112, the re-encoded PC1 bits may be combined with LL from received symbols for second control channel. At 1114, PC0 may be decoded to decode a second DCI. At 1116, processing related to the second DCI may be performed. Combination of the re-encoded PC1 bits and PC0 bits may configure a full size of N coded bit symbols for full decoding. This may provide a performance improvement in the decoding of the second DCI. Decoding for the second DCI may be performed by a half size N/2, for example, when re-encoding and combining is not implemented. Error(s) that may occur during a decoding process for the first DCI (e.g., due to channel impairment) may be detected. A remaining decoding process for a second DCI may not proceed, for example, when error(s) in the decoding of the first DCI are detected. A complete successful decoding of a second DCI may indicate accuracy or improved performance, for example, given that completion indicates there were no error(s) in the first DCI decoding.

The two stage DCI as illustrated in FIG. 11 may be extended to multi-stage DCI. In an example where $N_1=2^{n_1}$, there may be $N_1$ level DCI and a procedure comprising $N_1$ stages of decoding. When $N_1>2$, Multiple input bit blocks and corresponding output bit blocks may be combined. For example, with $N_1=4$, the first three input blocks may be combined and used for a second stage DCI and a last block may be used for a first stage DCI. This may be another configuration example for two stage DCI with different coded block length. In an example, the last three blocks may be combined and used for a first DCI and the first block may be used for a second stage DCI.

Multi-stage DCI (e.g., two-stage DCI) may be used to reduce false alarm rate. For example, in a two stage DCI, each of the DCIs may be separately encoded. The plurality of DCIs may be sequentially decoded. Decoding of a first DCI may experience a false alarm, for example, due to blind detection and a limited number of CRC bits. A wrong first DCI may be decoded that may pass a CRC check. A wrong decoding of the first DCI may result in failure to decode downlink control information resulting in failure to receive/transmit data.

A second level of error-detection for a first DCI may be deployed, for example, when encoding the second DCI. The second level of error detection may be used to reduce false alarm rate of a first DCI. In an example, part or all of a first DCI may be part of frozen bits, for example, when using a polar code to encode the second DCI.

Figure 12:
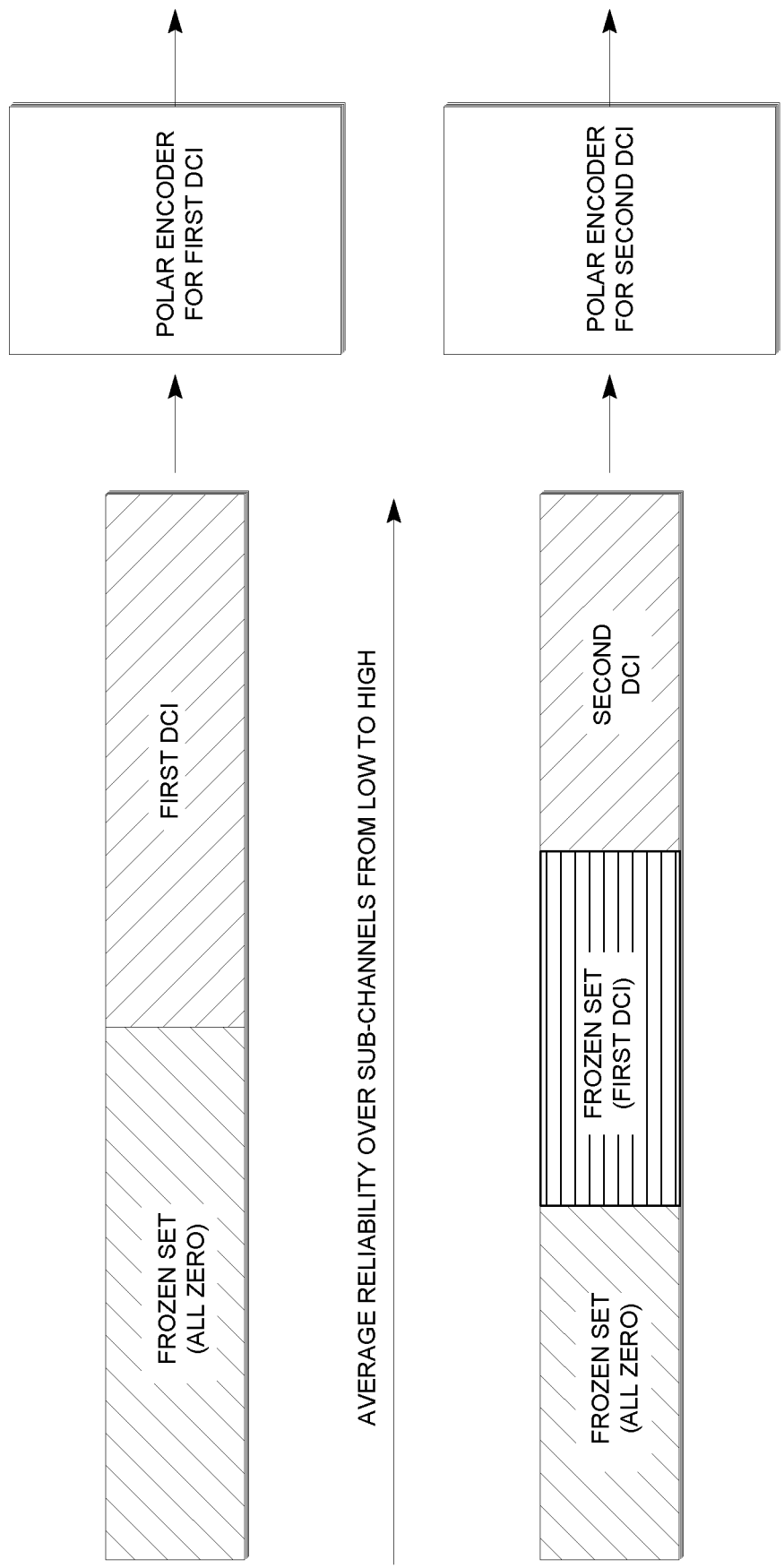
FIG. 12 illustrates an exemplary encoder structure for a polar coded two stage DCI, where some or all of bits belonging to a first DCI are used as frozen bits in encoding a second DCI.

FIG. 12 illustrates an exemplary encoder structure for a polar coded two stage DCI, where some or all of a first DCI is used as frozen bits in encoding a second DCI, for example, for reception by a decoder at a WTRU. As illustrated in FIG. 12, information bits corresponding to a first DCI may be polar encoded, for example, for reception by a decoder in a WTRU. The information bits corresponding to the first DCI may be used as frozen bits for encoding information bits corresponding to a second DCI. As illustrated in FIG. 12, the second DCI may be polar encoded with information corresponding to the first DCI embedded as part of the frozen set that is used to polar encode the second DCI. For example, in polar coding, frozen bits may be a constant set of bits. Each of the frozen bits may be of a constant value, for example, zero. The frozen bits may be known to an encoder and a decoder. As illustrated in FIG. 12, the frozen set comprising information corresponding to the first DCI may be mapped to bit channels with lesser reliability than the bit channels used for mapping the second DCI.

A WTRU may receive a polar encoded first DCI. The WTRU may decode the polar encoded first DCI. The WTRU may receive a polar encoded second DCI. The first DCI or the second DCI may be a group DCI. The polar encoded transmission associated with the second DCI may include an embedded first DCI that may be part of a frozen set. The polar encoded second DCI may be received via a plurality of bit channels with higher reliability. The embedded first DCI may be received via a plurality bit channels with lower reliability. The WTRU may decode the polar encoded second DCI using the decoded first DCI as part of frozen bits. For example, the WTRU may decode the first DCI or the second DCI using at least one of successive cancellation (SC) decoding, multi-stage decoding, or joint SC decoding. The multi-stage decoding and the joint SC decoding mechanisms are described herein.

Insertion of a first DCI into a frozen set at an encoder while encoding a second DCI may not affect the decoding of the second DCI at a decoder, for example, when the first DCI is decoded correctly, as in that case, the first DCI is known to both the encoder and the decoder. Decoding of the second DCI, using the first DCI as frozen bits may not succeed, for example, when the first DCI is incorrectly decoded. A WTRU may be able to detect a decoding error of the first DCI, for example, given that the WTRU may know the first DCI. The WTRU may discard both the first DCI and the second DCI, if wrong decoding of second DCI is detected. The WTRU may keep both the first DCI and the second DCI, if the WTRU correctly detects decoding of second DCI.

A false alarm rate of a first DCI may be reduced, for example, by applying a WTRU ID (e.g., cell radio network temporary identifier (C-RNTI)) or group ID in the encoding of a second DCI. For example, an XOR of all or part of a WTRU ID and all or part of a first DCI may be used as frozen bits while encoding a second DCI.

Figure 13:
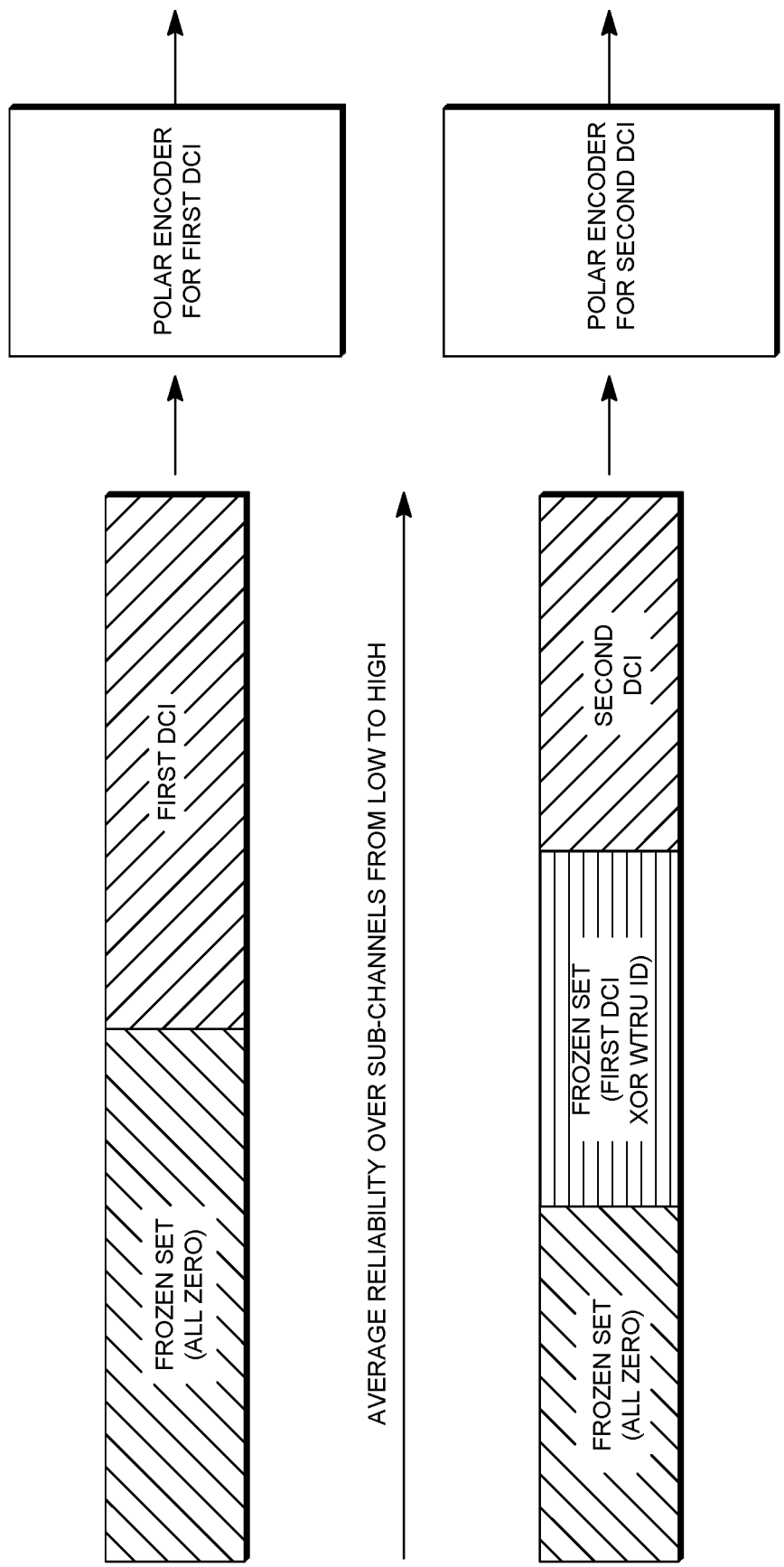
FIG. 13 illustrates an exemplary encoder structure for a polar coded two stage DCI, where a first DCI may be XOR-ed with a WTRU ID, and all or some of the XOR-ed bits are used as frozen bits in encoding a second DCI.

FIG. 13 illustrates an exemplary encoder structure for a polar coded two stage DCI, where a first DCI XOR-ed with a WTRU ID, and all or some of the XOR-ed bits may be used as frozen bits in encoding a second DCI. As illustrated in FIG. 13, the DCI XOR-ed with the WTRU ID may be embedded as part of frozen set that is used to polar encode the second DCI. The XOR operation may be replaced with another operation, for example, a scrambling operation.

Parity Check (PC) polar codes may be used to encode a first DCI. With PC polar codes, a WTRU ID may be used to scramble PC frozen bits, as illustrated in FIG. 9 herein. PC polar codes may be used to encode a second DCI. The first DCI may be embedded as part of the PC frozen that may be used to polar encode a second DCI. The first DCI may be used to scramble PC frozen bits for encoding the second DCI, for example, as illustrated in FIG. 14.

Figure 14:
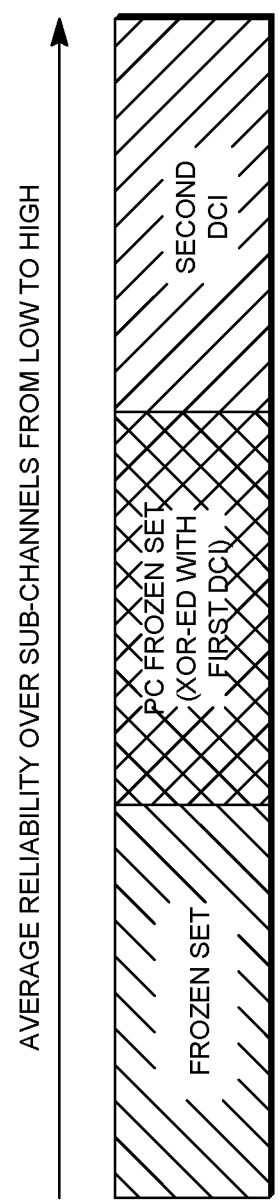
FIG. 14 illustrates an exemplary encoder structure for a PC polar coded two stage DCI, in part, where a second DCI may be encoded by a PC polar code with PC frozen bits XOR-ed with first DCI.

FIG. 14 illustrates an exemplary encoder structure for a PC polar coded two stage DCI, where a second DCI may be encoded by a PC polar code with PC frozen bits XOR-ed with first DCI. A WTRU ID may be used together with a first DCI to XOR PC frozen bits. All or part of a WTRU ID may be concatenated with all or part of a first DCI, for example, when XOR-ing with PC frozen bits. In an example, as illustrated in FIG. 14, all or part of a WTRU ID may be XOR-ed with all or part of a first DCI, which may be XOR-ed with PC frozen bits. In an example, CRC bits for a first DCI may be used in addition to or in place of all or part of a WTRU ID or all or part of first DCI information when encoding the second DCI. As illustrated in FIG. 14, the first DCI XOR-ed with the PC frozen bits may be mapped to less reliable bit channels than the bit channels to which the second group DCI may be mapped.

Multi-stage (e.g., two-stage) group-based DCI may be provided. In a group setting, each of the PDCCHs may carry a DCI that may be protected by a CRC (e.g., a 16-bit CRC). Each of the DCIs may be transmitted on a separate PDCCH creating a CRC overhead, for example, when multiple WTRUs are scheduled in a single TTI. A polar code may be used for encoding/decoding a DL control channel in new radio (NR). The NR DL control channel may be an NR-PDCCH or an NR-ePDCCH. A group-based DCI may group multiple DCIs together that may be protected by a single CRC. Such a group-based DCI protected by a single CRC may be used to reduce CRC overhead and enhance channel coding gain. Polar coding may then be used to encode/decode such group-based DCI. In polar coding, gain may be proportional to the length of an information block.

In an example, scheduled WTRUs may be divided into multiple groups. Each of the groups may have a group identity (group ID). The group identity information may be signaled by radio resource control (RRC) messages or layer 2 (L2) messages. Each of the group of DCIs protected by a single CRC may be appended by an indication identifying the WTRU for which the group-based DCI is intended. The relationship of a WTRU with a DCI group may be indicated, for example, by a binary bit-map or a pre-defined/specified sequence. CRC parity bits that may be calculated from a grouped DCI may be scrambled. For example, the CRC parity bits may be scrambled using a group identity (group ID). The group ID may be known to both the transmitter and each of the receivers. A WTRU may be configured to monitor a group-based DCI. A WTRU may blindly detect a DCI, for example, based on a group ID and an indication of a WTRU within the group. A grouped DCI along with a CRC may be polar encoded.

A two stage DCI procedure may be applied to group-based DCI. Two group-based DCIs may be separately encoded and may be sequentially decoded. Decoding of a first group DCI may experience a false alarm, for example, due to a blind detection and limited number of CRC bits. An inaccurate group DCI may have result in inability to further decode data. False alarm rate associated with the first group DCI may be reduced, for example, by deploying an additional level of error-detection when encoding a second group DCI. In an example, part or all of a first group DCI may be used as frozen bits, for example, when using polar code to encode a second group DCI.

Figure 15:
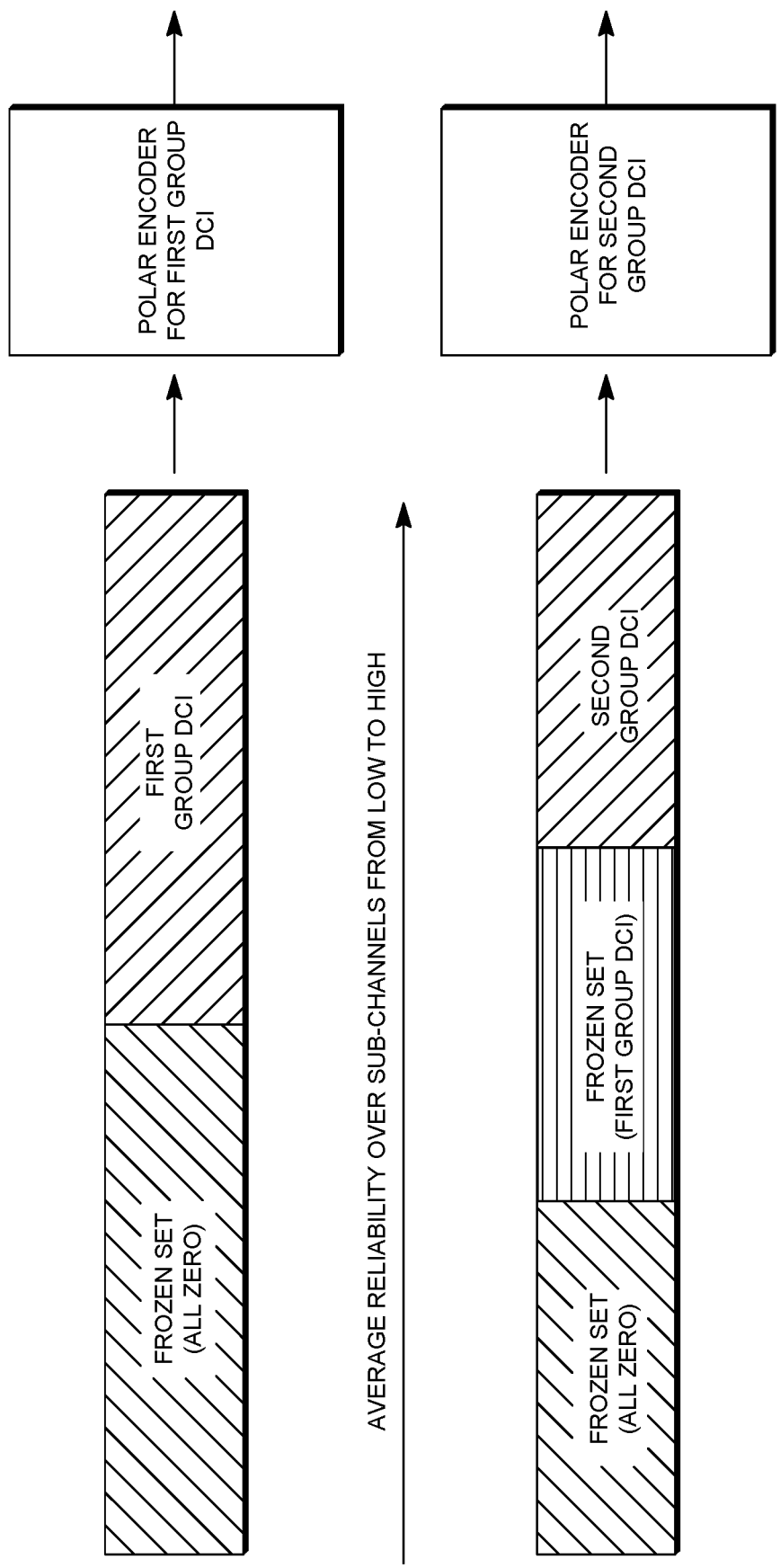
FIG. 15 illustrates an exemplary encoder structure for a polar coded two stage group-based DCI, where some or all of a first group DCI may be used as frozen bits in encoding a second group DCI.

FIG. 15 illustrates an exemplary encoder structure for a polar coded two stage group-based DCI. As illustrated in FIG. 15, a first group DCI may be used as frozen bits or part of frozen bits. A second group DCI may be polar encoded with information corresponding to the first group DCI that is embedded as part of the frozen set. As illustrated in FIG. 15, the frozen set comprising information corresponding to the first group DCI may be mapped to bit channels with lesser reliability than the bit channels used for mapping the second group DCI.

Figure 16:
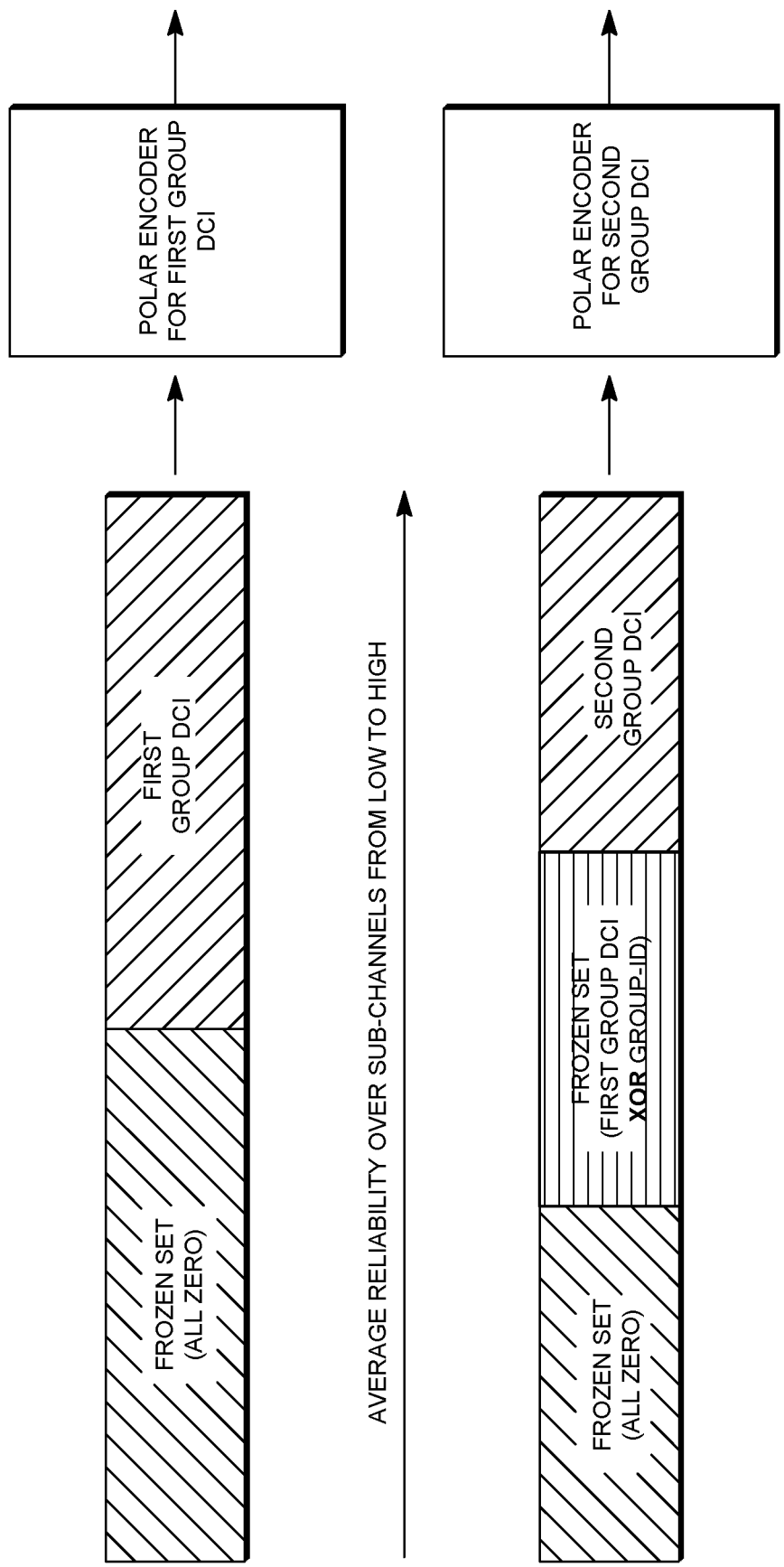
FIG. 16 illustrates an exemplary encoder structure for a polar coded two stage group DCI, where a first group DCI XOR-ed with a group ID, and all or some of the XOR-ed bits may be used as frozen bits in encoding a second group DCI.

In an example of reducing false alarm rate associated with the first group DCI, a group ID may be utilized in encoding of a second group DCI. For example, all or part of a group ID XOR-ed with all or part of a first DCI may be utilized as frozen bits while encoding a second group DCI. FIG. 16 illustrates an exemplary encoder structure for a polar coded two stage group DCI. As illustrated in FIG. 16, a first group DCI XOR-ed with a group ID may be utilized as frozen bits in an encoding a second group DCI. The second group DCI may be polar encoded with information corresponding to the first group DCI XOR-ed with a group ID. that the first group DCI XOR-ed with the group ID may be embedded as part of the frozen set corresponding to the second group DCI. In an example, the XOR operation may be substituted by another operation, for example, a scrambling operation. As illustrated in FIG. 16, the frozen set comprising information corresponding to the first group DCI may be mapped to less reliable bit channels, whereas the second group DCI may be mapped to bit channels with higher reliability.

PC polar codes instead of normal polar codes may be used to encode a first group DCI. With PC polar codes being used to encode a first group DCI, a group ID may be used to scramble PC frozen bits, for example, as illustrated in FIG. 9. PC polar codes may be used to encode a second group DCI. With PC polar codes being used to encode the second group DCI. a first group DCI may be used to scramble PC frozen bits, and used to encode the second group DCI.

Figure 17:
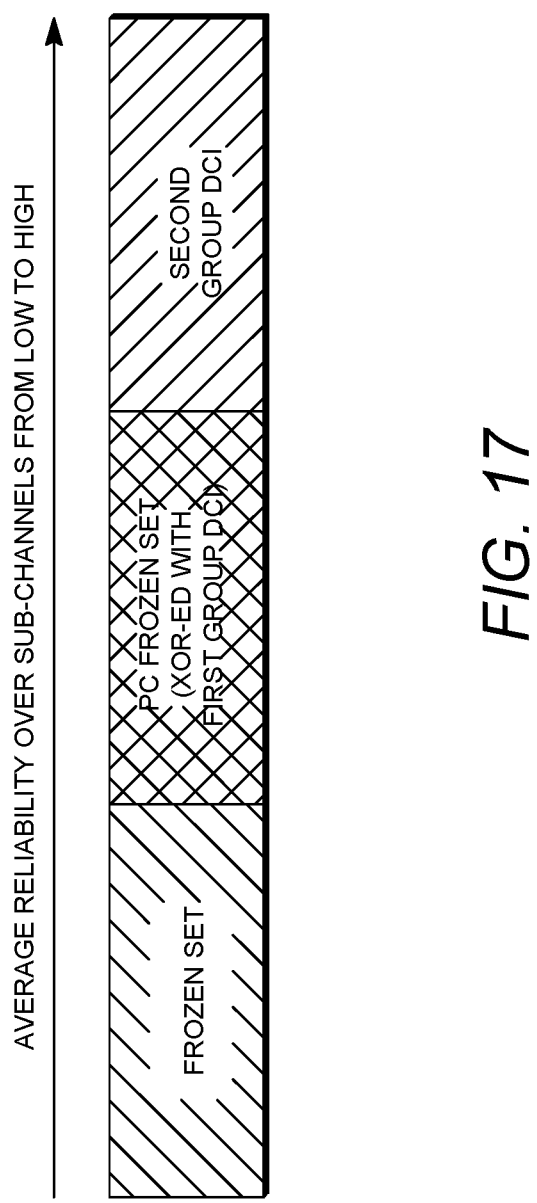
FIG. 17 illustrates an exemplary encoder structure for a PC polar coded two stage group DCI, in part, where a second group DCI may be encoded by a PC polar code with PC frozen bits XOR-ed with first group DCI.

FIG. 17 is an example of a second group DCI encoded by a PC polar code. As is illustrated in FIG. 17, PC frozen bits or PC frozen set may be XOR-ed with a first group DCI. A group ID may be used together with a first group DCI to XOR PC frozen bits. All or part of a group ID may be concatenated with all or part of a first group DCI, for example, when XOR-ing the PC frozen bits.

In an example, all or part of a group ID may be XOR-ed with all or part of a first group DCI, which may be XOR-ed with the PC frozen bits. In an example, CRC bits for a first group DCI may be substituted for all or part of a group ID or all or part of a first group DCI information, for example, while polar encoding a second group DCI. All or part of first group DCI may, therefore, be embedded as part of a frozen set that may be used to polar encode the second group DCI. As illustrated in FIG. 17, the frozen set comprising information corresponding to the first group DCI and XOR-ed with the PC frozen bits may be mapped to bit channels with lesser reliability than the bit channels used for mapping the second group DCI.

Rate matching may be provided for polar codes. Block based puncturing may be used to achieve rate matching of polar codes. Puncturing may be used without reconstructing polar codes. An exemplary first pattern $N_p$ may be the number of punctured bits and the positions BR(N−1−p, n), p=0, 1, . . . , $N_p$−1 of coded bits may be punctured. When bit reserving matrix is applied at the encoder (e.g., the generator matrix in Eq. 2), corresponding input bits N−1−p, p=0, 1, . . . , $N_p$−1 may be included in the frozen bits. Some frozen bits before puncturing may be included in unfrozen bits, for example, to keep the same number of input bits due to the inclusion. This may not need reconstruction. The original order of reliability among input bits may be reused. When bit reversing matrix is not applied at the encoder (e.g., the generator matrix in Eq. 4), corresponding input bits included in the frozen bits may be represented by: BR(N−1−p, n). BR( ) may be an operation of bit reversing. For example, BR(3,3)=BR(011,3)=110 with a length of 3. There may be other puncturing patterns that may not need reconstruction.

In an exemplary second pattern, $N_p$ may be the number of punctured bits and the positions N−1−p, p=0, 1, . . . , $N_p$−1 of coded bits may be punctured. When bit reserving matrix is applied at the encoder (e.g., the generator matrix in Eq. 2), corresponding positions of input bits BR(N−1−p, n), p=0, 1, . . . , $N_p$−1 may be included in the frozen bits. When bit reversing matrix is not applied at the encoder (e.g., the generator matrix in Eq. 4), corresponding input bits included in the frozen bits may be N−1−p, for example, when a bit reversing matrix. is not applied. Corresponding input bits to punctured output bits may have a zero value. This may be different from other implementations of frozen bits that may have arbitrary values when they are predefined.

A multilevel structure of a polar code may be provided. A puncturing pattern may be extended to a block or group based pattern. The same pattern based on a block of length $N_1$ may be applied. The exemplary first and second patterns described herein may be extended to a block based approach, for example, for a block of $N_B=2^{n_B}$.

In an exemplary first block-based pattern, assuming $N_p$ is the number of punctured bits, the positions of coded bits that may be punctured may be given by:

$$BR\left(\frac{N}{N_B} - 1 - p, n - n_B\right) \times N_B + i,$$

p=0, 1, . . . , $N_p/N_B$−1, i=0, 1, . . . , $N_B$−1. When bit reserving matrix is applied at the encoder (e.g., the generator matrix in Eq. 2), corresponding input bits $(N/N_B-1-p) \times N_B + i$, p=0, 1, . . . , $N_p/N_B$−1, i=0, 1, . . . , $N_B$−1 may be included in frozen bits. One or more frozen bits (e.g., before puncturing) may be included in unfrozen bits, for example, due to the inclusion of the input bits in the frozen bits and to keep the total number of input bits a constant. No reconstruction such frozen bits may be performed, and the original order of reliability among input bits may be reused.

In an example second block-based pattern with $N_p$ number of punctured bits, the positions of coded bits that may be punctured may be given by:

$$BR\left(\frac{N}{N_B} - 1 - p, n - n_B\right) \times N_B + i,$$

p=0, 1, . . . , $N_p/N_B$−1, i=0, 1, . . . , $N_B$−1. The corresponding positions of input bits $$BR\left(\frac{N}{N_B} - 1 - p, n - n_B\right) \times N_B + i,$$

p=0, 1, . . . , $N_p/N_B$−1, i=0, 1, . . . , $N_B$−1 may be included in the frozen bits, for example, when a bit reversing matrix may not be applied (e.g., the generator matrix in Eq. 4), as described herein.

In an example third block-based pattern, assuming $N_p$ is the number of punctured bits, the positions of coded bits that may be punctured may be given by: $(N/N_B-1-p) \times N_B + i$, p=0, 1, . . . , $N_p/N_B$−1, i=0, 1, . . . , $N_B$−1. When bit reserving matrix is applied at the encoder (e.g., the generator matrix in Eq. 2), the corresponding positions of input bits $$BR\left(\frac{N}{N_B} - 1 - p, n - n_B\right) \times N_B + i,$$

p=0, 1, . . . , $N_p/N_B$−1, i=0, 1, . . . , $N_B$−1 may be included in frozen bits.

In an example fourth block-based pattern, assuming $N_p$ is the number of punctured bits, the positions of coded bits that may be punctured may be given by: $(N/N_B-1-p) \times N_B + i$, p=0, 1, . . . , $N_p/N_B$−1, i=0, 1, . . . , $N_B$−1, for example, when a bit reversing matrix may not be applied. The corresponding input bits may be $(N/N_B-1-p) \times N_B + i$, p=0, 1, . . . , $N_p/N_B-1$, $i=0, 1, \ldots, N_B-1$, for example, when a bit reversing matrix may not be applied (i.e., the generator matrix in Eq. 4), as described herein.

$N_B$ may be the same as or different than $N_1$. Block based puncturing may be used or extended to a pattern of puncturing, for example, that may be based on shortening. No reconstruction of frozen bits may be needed. The corresponding input bits that may depend on a structure, for example, in case without a bit reversing matrix. The corresponding input bits may be changed, for example, based on a scheme with (e.g., the generator matrix in Eq. 2) or without (e.g., the generator matrix in Eq. 4) bit reversing matrix applied at the encoder.

Block based puncturing may not require reconstruction for a decomposition structure polar code. Each of the component code blocks, $P_i$ as illustrated in FIG. 3 may not need to be reconstructed. A shift of reliability order may be provided for puncturing, for example, based on shortening. Assuming that a block $Q_j$ is punctured using block based puncturing as described herein and assuming multistage decoding, the same punctured bit indices with a fixed length may apply to each of the $P_i$, as illustrated in FIG. 3.

Figure 18:
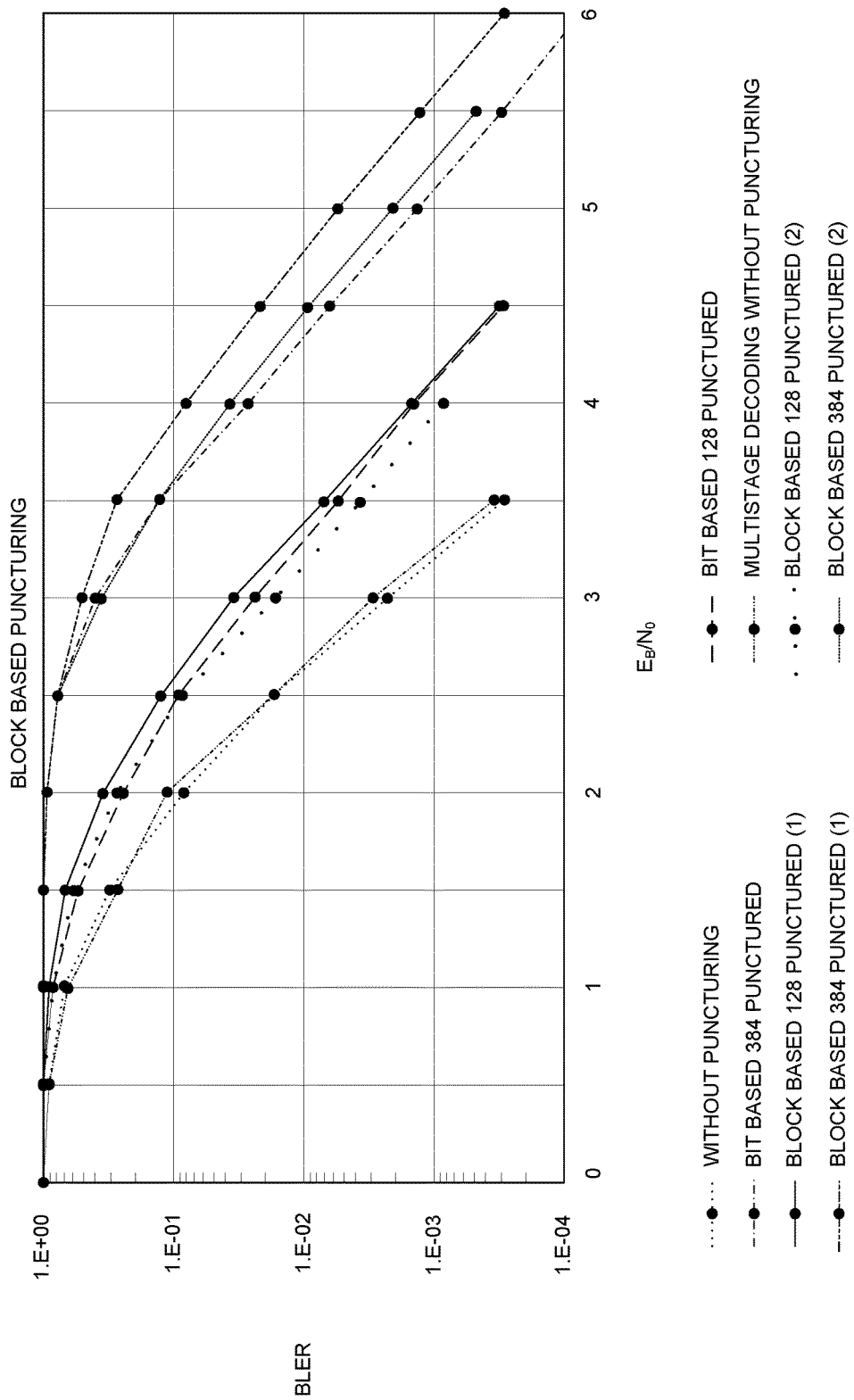
FIG. 18 illustrates block error ratio (BLER) performance comparison of various exemplary puncturing mechanisms.

FIG. 18 illustrates block error ratio (BLER) performance comparison of various exemplary puncturing mechanisms. FIG. 18 illustrates simulations that are based on, for example, N=1024, K=512, $N_1=4$ and BPSK modulation under additive white Gaussian noise (AWGN) channel. For example, two cases of $N_p=128$ and $N_p=384$ are simulated and compared. In examples of block based puncturing, $N_B=N_1=4$ coded bits of block are punctured or not punctured according to foregoing example patterns.

Comparison of examples in FIG. 18 show a minimal difference of performance between multi-stage decoding and SC decoding. The second puncturing pattern based on block with multistage decoding show nearly the same performance as another puncturing pattern. The first puncturing pattern show more difference than the second. The second block based puncturing shows a slightly (~0.1 dB) better performance than another (e.g. conventional) puncturing scheme, for example, when the number of punctured bits may be relatively small (e.g. $N_p=128$).

A code rate for each component code $P_i$ may the identical, for example, when block based puncturing is applied and the number of inputs are the same. A different code rate for each component code may be implemented and may be accomplished, for example, by one or more example approaches.

In an example, one of the component codes may be a reference component code. Block based puncturing may be utilized by the reference component code. A reference component code may be predefined. A control channel (e.g., a corresponding component code) carrying the first DCI or the second DCI may be selected as a reference component code. A reference component code may be signaled, and may be WTRU-specific or may be WTRU-group specific. A reference component code may be dynamically or semi-statically signaled. A reference component code may require a highest code rate or may require a largest number of puncturing instances. One or more component codes except the reference component code, for example after block based puncturing, may include repetitions to meet a code rate that may be required for each component code.

Multiple DCIs may be configured by separate (e.g., independent) control channels, for example, instead of a scheme that may be based on decomposition. A base station (e.g., gNB) may determine and signal a scheme to a WTRU or a UE. The scheme may provide an indication whether a separate scheme is applied to each of the DCIs or a scheme based on decomposition is applied to multiple DCIs. Signaling may be WTRU-specific or group specific (e.g., common for a group of WTRUs or UEs). Signaling may be dynamical or semi-static.

Repetition of output bits may be utilized. For example, output bits $c_i$ ($i=0, 1, \ldots, N-1$) of a polar encoder may be repeated by using a pattern of bit reversing. In an example where R bits may need to be repeated, $c_{BR(j,n)}$ ($j=0, 1, \ldots, R-1$) may be repeated.

Bit reversing based repetition may start from a starting index (e.g., from 0 to N-1) or from an ending index (e.g. from N-1 to 0). Starting from a starting index may be indicated, for example, by $c_{BR(j,n)}$ ($j=0, 1, \ldots, R-1$). Starting from an ending index may be indicated, for example, by N-1, $c_{BR(N-1-j,n)}$ ($j=0, 1, \ldots, R-1$).

Bit reversing based repetition may have an offset. An index of repetition position may be given by, for example, (BR(j, n)+$O_{BR}$) % N or (BR(N-1-j, n)+$O_{BR}$) % N. $O_{BR}$ may be an offset value, % may be a modular operator and a % b may be a remainder of a/b.

Bit reversing based repetition may provide an asymptotically uniform pattern and may provide stable performance for a wide range of repetition. Bit reversing based repetition may be implemented, for example, by a very simple hardware construction.

Output bits $c_i$ ($i=0, 1, \ldots, N-1$) of a polar encoder may be repeated in a serial manner. In an example (e.g. where R bits may be repeated), $c_j$ ($j=0, 1, \ldots, R-1$) or $c_{N-1-j}$ ($j=0, 1, \ldots, R-1$) may be repeated with or without an offset.

Repetition may consider or account for reliabilities of input bits. In an example (e.g. where F(k)(k=0, 1, \ldots, N-1) may indicate an index of N-1-k-th reliable bit in the input bits), F(k)(k=0, 1, \ldots, N-1) may be included in deciding positions of repetition in the output bits. For example, F(0) may be an input index of a least reliable bit and F(N-1) may be an input index of a most reliable bit.

Input bits may be uniformly selected in the domain of reliability. Output bits associated with selected input bits may be repeated. Association between the output bits and the input bits may imply that a relation between an input bit index and an output bit index. The relation may be of multiple types. For example, an input bit index may include bit reversing of an output bit index. In an example, an input bit index may be identical to an output bit index.

An input index may be selected (e.g., uniformly selected) in a reliability domain. Selection of an input bit index may comprise selecting intervals of $\lfloor N/R \rfloor$ and $$F\left(\left\lfloor \frac{N}{R} \times i \right\rfloor\right),$$

$i=0, 1, \ldots, R-1$, where $\lfloor \alpha \rfloor$ may indicate the nearest integer of real number a and $$BR\left(F\left(\left\lfloor \frac{N}{R} \times i \right\rfloor\right), n\right) \text{ or } F\left(\left\lfloor \frac{N}{R} \times i \right\rfloor\right)$$

may be an output bit index of repetition.

Reliability based repetition may be used instead of bit reversing based repetition, for example, when a code rate may be high and the number of repetitions may be relatively large. Reliability based repetition may be more complex than a bit reversing based repetition, for example, because reliability based repetition may require memorizing reliability index F(k) and may include additional operation(s) for indexing.

Input indexes may be uniformly selected using, for example, bit reversing, random type interleaver, and/or a rate matching algorithm. In an example of bit reversing, a repetition index that may be used for bit reversing based repetition may be used for the selection of input bits. In an example of a random type interleaver, some part of output bits from a random interleaver may be selected for the selection of input bits. A random interleaver may be a subblock interleaver, for example, as use in LTE.

In an example of a rate matching algorithm (e.g., as used in LTE), a rate matching algorithm that may generate patterns of puncturing and repetition uniformly distributed may be used for the selection of input bits. A rate matching algorithm may subtract a value that may be defined by the number of puncturing or repetition from an initial value. The subtraction may be performed iteratively. Puncturing or repetition may occur, for example, when it reaches a value less than zero.

Reliability based repetition may start from the starting index of a reliability domain or an input index domain. Reliability based repetition may start from the ending index of a reliability domain or an input index domain. In an example, there may be four variants of repetition, such as $$BR\left(F\left(N-1-\left\lfloor\frac{N}{R}\times i\right\rfloor\right), n\right) \text{ or } F\left(N-1-\left\lfloor\frac{N}{R}\times i\right\rfloor\right)$$
$$\text{or } BR\left(N-1-F\left(\left\lfloor\frac{N}{R}\times i\right\rfloor\right), n\right) \text{ or } N-1-F\left(\left\lfloor\frac{N}{R}\times i\right\rfloor\right).$$

In an example of reliability based repetition, an offset may be added in a reliability domain or an input index domain. Modular operation may be imposed after adding the offset.

Figure 19:
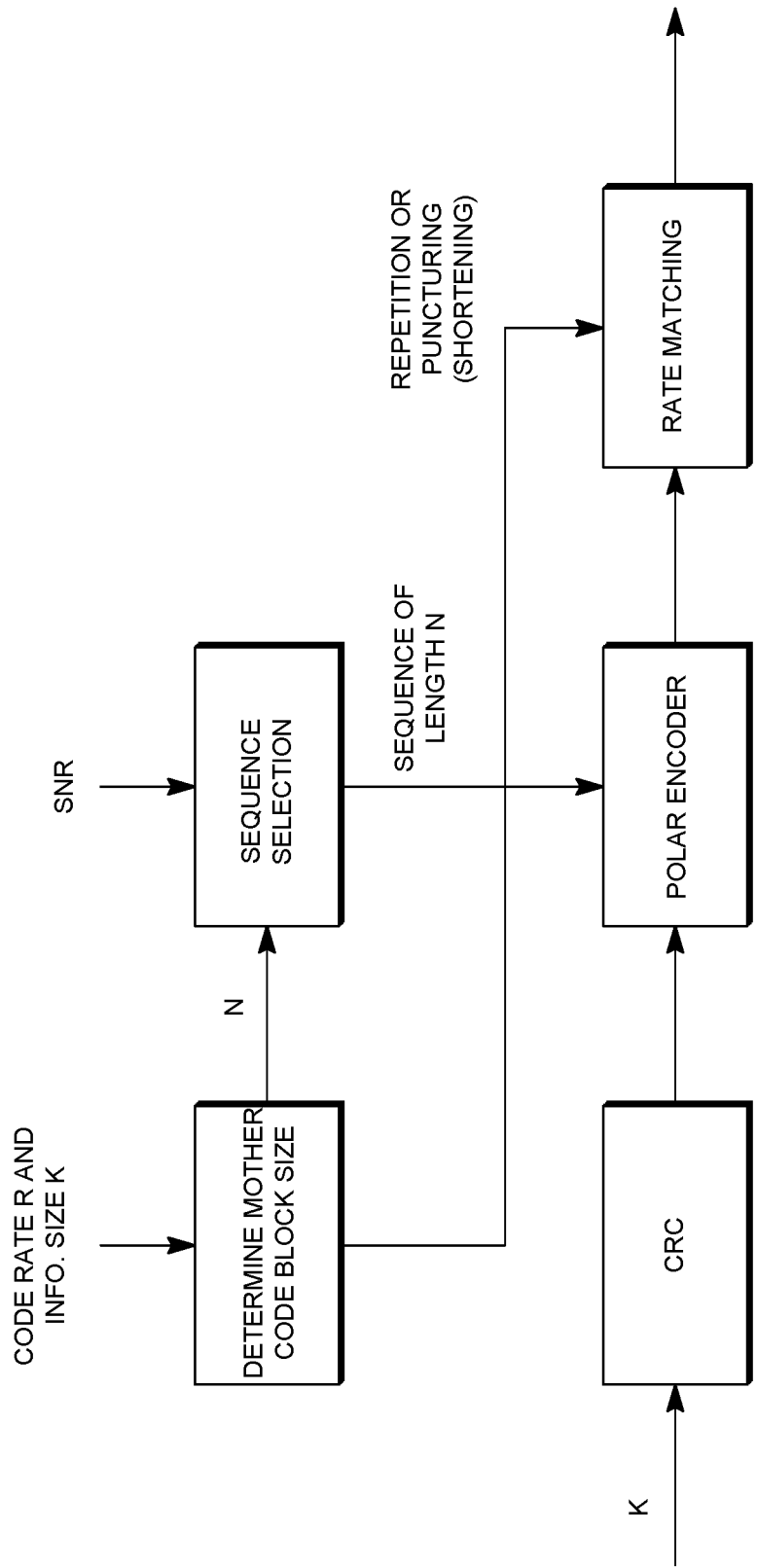
FIG. 19 illustrates an exemplary polar encoding system for control information.

FIG. 19 is an example of a polar encoding system for control information. CRC bits, e.g., for error detection, may be attached to control information (e.g., uplink control information (UCI), and downlink control information (DCI)). As illustrated in FIG. 19, a mother code block size may be determined based on one or more inputs such as code rate R, information block size K, etc. CRC bits (e.g., 16 CRC bits) may be added to information block size K. A total number of coded bits may be calculated, e.g., $$N = \frac{K + CRC}{R}$$

bits. An integer n may be determined, for example, such that $2^n \leq N < 2^{n+1}$. For example, a mother code block size of a polar code may be determined between $2^n$ and $2^{n+1}$. A repetition scheme (e.g., by repeating $N-2^n$ bits) may be used to match desired coded bits N. A puncturing scheme (e.g., by puncturing $2^{n+1}-N$ bits) may be used to match desired coded bits N. A determination between puncturing and repetition may be based on different criteria. For example: (1) A puncturing scheme may be used, for example, when $N-2^n > T_1$ bits. Otherwise, a repetition scheme may be used. (2) A puncturing scheme may be used, for example, when $2^{n+1}-N < T_2$ bits. Otherwise, a repetition scheme may be used. (3) A puncturing scheme may be used, for example, when $$\frac{N-2^n}{2^n} > T_3.$$

Otherwise, a repetition scheme may be used. (4) A puncturing scheme may be used, for example, when $$\frac{2^{n+1}-N}{2^{n+1}} < T_4.$$

Otherwise, a repetition scheme may be used.

As illustrated in FIG. 19, in addition to determining a mother code block size (e.g. $2^n$ or $2^{n+1}$), a determination may be made whether puncturing or repetition is used as a shortening mechanism. For example, a determination of a mother code block size may be used to determine a sequence selection. Sequence selection may determine or save one or more reliability rank sequences. A sequence may be selected for the encoding of the control information based on, for example, a channel condition (e.g., signal-to-noise ratio (SNR)). A mother code block size may, for example, reduce or expand the selected sequence to the determined code block size. A selected sequence (e.g., of length $2^n$ or $2^{n+1}$) may be used to determine a polar code for use in encoding control information. SNR-dependent multiple sequence selection may be applied.

A polar encoder may map input bits to non-frozen bit sets, for example, based on an input sequence. A polar encoder may apply XOR operations for the polar encoding. A polar encoder may be based on PC polar coding or other (e.g., regular) polar coding.

A polar encoder may generate an output sequence of length $2^n$ or $2^{n+1}$. Output bits may be saved, for example, saved in a circular buffer in case of repetition. Output bits may or may not be reshuffled (e.g., reordered) before saving. The reshuffled output bits may be saved in a circular buffer. For example, reshuffling may not be implemented for a sequential-type of repetition. Reshuffling may be implemented for a bit-reversal-type of repetition. The exemplary repetition schemes described above may be implemented.

Features, elements and actions (e.g., processes and instrumentalities) are described by way of non-limiting examples. While examples are directed to LTE, LTE-A, New Radio (NR) or 5G protocols, subject matter herein is applicable to other wireless communications, systems, services and protocols. Each feature, element, action or other aspect of the described subject matter, whether presented in figures or description, may be implemented alone or in any combination, including with other subject matter, whether known or unknown, in any order, regardless of examples presented herein.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU, WTRU, terminal, base station, RNC, or any host computer.

What is claimed:

1. A wireless transmit/receive unit (WTRU) comprising:
a processor configured to at least:
receive first polar encoded bits comprising an encoded first downlink control information (DCI);
decode the first polar encoded bits comprising the encoded first DCI to obtain a decoded first DCI;
receive second polar encoded bits comprising a second DCI and the first DCI, wherein the first DCI is part of a frozen set, wherein the frozen set is associated with the second DCI, wherein a first subset of the second polar encoded bits comprising the second DCI is received in a first plurality of bit channels and a second subset of the second polar encoded bits comprising the first DCI is received in a second plurality of bit channels, and wherein reliability of the first plurality of bit channels is higher than reliability of the second plurality of bit channels; and
attempt to decode the second polar encoded bits using the decoded first DCI to obtain a decoded second DCI.

2. The WTRU of claim 1, wherein the first DCI in the second polar encoded bits is masked with at least part of one of a WTRU identity (WTRU ID) or a group identity (group ID).

3. The WTRU of claim 2, wherein the first DCI in the second polar encoded bits and the at least part of one of the WTRU ID or the group ID are combined using an XOR operation.

4. The WTRU of claim 1, wherein the decoded first DCI comprises a time critical DCI.

5. The WTRU of claim 4, wherein the time critical DCI comprises one or more of allocation information for a physical downlink shared channel (PDSCH) or a physical uplink shared channel (PUSCH), rank information, or modulation order.

6. The WTRU of claim 1, wherein being configured to attempt to decode the second DCI comprises being configured to attempt decoding of the second DCI using the decoded first DCI as frozen bits, and wherein the decoded second DCI comprises a non-time critical DCI.

7. The WTRU of claim 6, wherein the non-time critical DCI comprises one or more of a new data indication (NDI), a redundancy version (RV), or a modulation and coding scheme (MCS).

8. The WTRU of claim 1, wherein the WTRU is part of a configured group of WTRUs.

9. The WTRU of claim 8, wherein each of the decoded first DCI and the decoded second DCI is a respective group DCI associated with the configured group of WTRUs.

10. The WTRU of claim 1, wherein being configured to attempt to decode the second DCI comprises being configured to attempt decoding of the second DCI using the decoded first DCI as frozen bits.

11. The WTRU of claim 1, wherein the processor is further configured to determine whether to keep the first DCI based on whether the attempted decoding of the second polar encoded bits is successful.

12. A polar decoding method implemented by a wireless transmit receive unit (WTRU) comprising:
receiving first polar encoded bits comprising an encoded first downlink control information (DCI);
decoding the first polar encoded bits comprising the encoded first DCI to obtain a decoded first DCI;
receiving second polar encoded bits comprising a second DCI and the first DCI, wherein the first DCI is part of a frozen set, wherein the frozen set is associated with the second DCI, wherein a first subset of the second polar encoded bits comprising the second DCI is received in a first plurality of bit channels and a second subset of the second polar encoded bits comprising the first DCI is received in a second plurality of bit channels, and wherein reliability of the first plurality of bit channels is higher than reliability of the second plurality of bit channels; and
attempting to decode the second polar encoded bits using the decoded first DCI to obtain a decoded second DCI.

13. The method of claim 12, wherein the first DCI in the second polar encoded bits is masked with at least part of one of a WTRU identity (WTRU ID) or a group identity (group ID).

14. The method of claim 13, wherein the first DCI in the second polar encoded bits and the at least part of one of the WTRU ID or the group ID are combined using an XOR operation.

15. The method of claim 12, wherein the decoded first DCI comprises a time critical DCI, wherein the time critical DCI comprises one or more of allocation information for a physical downlink shared channel (PDSCH) or a physical uplink shared channel PUSCH, rank information, or modulation order.

16. The method of claim 12, wherein the decoded second DCI comprises a non-time critical DCI, wherein the non-time critical DCI comprises one or more of a new data indication (NDI), a redundancy version (RV), or a modulation and coding scheme (MCS).

17. The method of claim 12, wherein the WTRU is part of a configured group of WTRUs, wherein each of the decoded first DCI and the decoded second DCI is a respective group DCI associated with the configured group of WTRUs.

18. The method of claim 12, further comprising determining whether to keep the first DCI based on whether the attempted decoding of the second polar encoded bits is successful.

* * * * *